(12) United States Patent
Chen et al.

(10) Patent No.: US 12,218,097 B2
(45) Date of Patent: Feb. 4, 2025

(54) BONDING TO ALIGNMENT MARKS WITH DUMMY ALIGNMENT MARKS

(71) Applicant: Taiwan Semiconductor Manufacturing Co., Ltd., Hsinchu (TW)

(72) Inventors: Hsien-Wei Chen, Hsinchu (TW); Ying-Ju Chen, Tuku Township (TW); Ming-Fa Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/364,310

(22) Filed: Aug. 2, 2023

(65) Prior Publication Data
US 2023/0378122 A1 Nov. 23, 2023

Related U.S. Application Data

(63) Continuation of application No. 17/325,667, filed on May 20, 2021, now Pat. No. 11,862,599.
(Continued)

(51) Int. Cl.
*H01L 23/544* (2006.01)
*H01L 21/304* (2006.01)
(Continued)

(52) U.S. Cl.
CPC ............ *H01L 24/80* (2013.01); *H01L 21/304* (2013.01); *H01L 21/6835* (2013.01);
(Continued)

(58) Field of Classification Search
CPC ....... H01L 24/80; H01L 24/08; H01L 23/544; H01L 25/0657; H01L 2223/54426; H01L 2224/0217; H01L 2225/06593; H01L 25/50; H01L 2224/08145; H01L 2224/80139; H01L 2224/80895;
(Continued)

(56) References Cited

U.S. PATENT DOCUMENTS 6,774,477 B2 8/2004 Han
7,838,424 B2 11/2010 Karta et al.
(Continued)

FOREIGN PATENT DOCUMENTS

CN 111933618 A 11/2020
JP 2014157885 A 8/2014
(Continued)

*Primary Examiner* — Thanh Y. Tran
(74) *Attorney, Agent, or Firm* — Slater Matsil, LLP

(57) ABSTRACT

A method includes placing a first package component. The first package component includes a first alignment mark and a first dummy alignment mark. A second package component is aligned to the first package component. The second package component includes a second alignment mark and a second dummy alignment mark. The aligning is performed using the first alignment mark for positioning the first package component, and using the second alignment mark for position the second package component. The second package component is bonded to the first package component to form a package, with the first alignment mark being bonded to the second dummy alignment mark.

20 Claims, 25 Drawing Sheets

Related U.S. Application Data

(60) Provisional application No. 63/166,353, filed on Mar. 26, 2021.

(51) Int. Cl.

| | | |
|---|---|---|
| *H01L 21/683* | (2006.01) | |
| *H01L 21/768* | (2006.01) | |
| *H01L 23/00* | (2006.01) | |
| *H01L 23/48* | (2006.01) | |
| *H01L 25/00* | (2006.01) | |
| *H01L 25/065* | (2023.01) | |

(52) U.S. Cl.
CPC ...... *H01L 21/76898* (2013.01); *H01L 23/481* (2013.01); *H01L 23/544* (2013.01); *H01L 24/08* (2013.01); *H01L 25/0657* (2013.01); *H01L 25/50* (2013.01); *H01L 2221/68327* (2013.01); *H01L 2221/68372* (2013.01); *H01L 2223/54426* (2013.01); *H01L 2224/0217* (2013.01); *H01L 2224/08145* (2013.01); *H01L 2224/80006* (2013.01); *H01L 2224/80139* (2013.01); *H01L 2224/80895* (2013.01); *H01L 2224/80896* (2013.01); *H01L 2225/06541* (2013.01); *H01L 2225/06593* (2013.01)

(58) Field of Classification Search
CPC . H01L 2224/80896; H01L 2221/68372; H01L 2225/06541; H01L 24/06; H01L 24/09; H01L 2224/08058; H01L 2224/08146; H01L 2224/09517; H01L 2224/11015; H01L 2224/8013
See application file for complete search history.

(56) References Cited

U.S. PATENT DOCUMENTS

| | | |
|---|---|---|
| 7,863,742 B2 | 1/2011 | Yu et al. |
| 7,932,601 B2 | 4/2011 | Chang et al. |
| 8,754,508 B2 | 6/2014 | Chen et al. |
| 8,772,151 B2 | 7/2014 | Chen |
| 8,846,548 B2 | 9/2014 | Tu et al. |
| 9,716,069 B2 | 7/2017 | Takazawa et al. |
| 10,867,985 B2 | 12/2020 | Yu et al. |
| 11,309,223 B2 | 4/2022 | Yu et al. |
| 2013/0341800 A1 | 12/2013 | Tu et al. |
| 2014/0015122 A1 | 1/2014 | Chou et al. |
| 2014/0045379 A1 | 2/2014 | Chen |
| 2014/0048926 A1 | 2/2014 | Wang et al. |
| 2014/0077356 A1 | 3/2014 | Chen et al. |
| 2014/0077386 A1 | 3/2014 | Kuang |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |
| 2020/0159133 A1 | 5/2020 | Yan et al. |
| 2020/0161263 A1* | 5/2020 | Chen ................. H01L 24/06 |
| 2020/0335473 A1 | 10/2020 | Zhou et al. |
| 2021/0082874 A1 | 3/2021 | Chen et al. |
| 2021/0118832 A1* | 4/2021 | Chen ............. H01L 23/49503 |
| 2022/0285234 A1 | 9/2022 | Yokomizo et al. |
| 2022/0302078 A1* | 9/2022 | Chang ................. H01L 24/80 |

FOREIGN PATENT DOCUMENTS

| | | |
|---|---|---|
| KR | 20040015512 A | 2/2004 |
| KR | 20200002557 A | 1/2020 |
| TW | 201324629 A | 6/2013 |
| TW | 201714274 A | 4/2017 |

* cited by examiner

BONDING TO ALIGNMENT MARKS WITH DUMMY ALIGNMENT MARKS

PRIORITY CLAIM AND CROSS-REFERENCE

This application is a continuation of U.S. patent application Ser. No. 17/325,667, filed May 20, 2021, and entitled "Bonding to Alignment Marks with Dummy Alignment Marks," which claims the benefit of the U.S. Provisional Application No. 63/166,353, filed on Mar. 26, 2021, and entitled "WOW F2B Alignment Solution," which applications are hereby incorporated herein by reference.

BACKGROUND

In the formation of three-dimensional (3D) integrated circuits, wafers or device dies are stacked together to achieve more functionality. The stacking is typically achieved through bonding. In the bonding process, alignment marks may be formed for the bonding apparatus to align the stacked wafers/dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
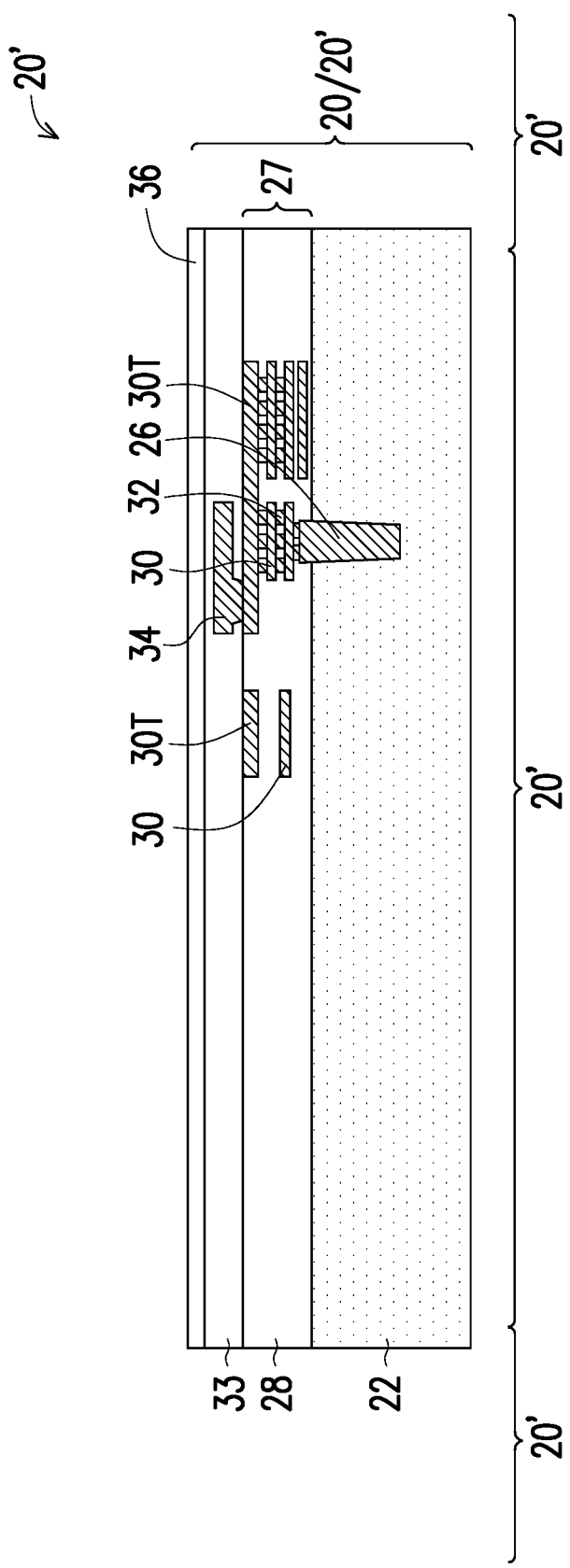
FIGS. 1-13 and 14A illustrate the cross-sectional views of intermediate stages in the alignment and the bonding of dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package component stack having alignment marks bonded to dummy alignment marks and the method of forming the same are provided. In accordance with some embodiments of the present disclosure, a first alignment mark is formed in a first package component, and is bonded to a first dummy alignment mark in a second package component. The first dummy alignment mark is not used for alignment purpose. Also, a second alignment mark may be formed in the second package component, and is bonded to a second dummy alignment mark in the first package component. By bonding alignment marks to dummy alignment marks instead of bonding to dielectric layers, the bonding strength is improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-13 and 14A illustrate the cross-sectional views of intermediate stages in the formation of a stack of package components including alignment marks and dummy alignment marks in accordance with some embodiments of the present disclosure. The corresponding processes are also reflected schematically in the process flow shown in FIG. 29.

Referring to FIG. 1, package component 20 is provided, which includes dies 20' therein. Package component 20 may further include substrate 22. In accordance with some embodiments, substrate 22 is a semiconductor substrate, which may be formed of or comprises a crystalline silicon substrate. Substrate 22 may also be formed of or comprise other semiconductor materials such as silicon germanium, carbon-doped silicon, or the like. In accordance with some embodiments, package component 20 is a device wafer, which includes active devices and/or passive devices therein. In accordance with alternative embodiments, package component 20 is an interposer wafer, which is free from active devices and passive devices therein. In accordance with alternative embodiments, package component 20 is a reconstructed wafer, which includes discrete dies encapsulated in an encapsulant (such as a molding compound), and redistribution lines formed to connect to the discrete dies. Package component 20 is referred to as wafer 20 hereinafter, which includes a plurality of dies 20' therein.

In accordance with some embodiments, device dies 20' include active circuits (not shown), which include active devices such as transistors (not shown) formed at the top surface of semiconductor substrate 22. In accordance with alternative embodiments in which wafer 20 is an interposer wafer, there is no active circuit at the top surface of wafer 20. Through-vias (sometimes referred to as Through-Silicon Vias (TSVs)) 26 may be formed to extend into substrate 22. TSVs 26 are also sometimes referred as through-silicon vias when formed in a silicon substrate. Each of TSVs 26 may be encircled by an isolation liner (not shown), which is formed of a dielectric material such as silicon oxide, silicon nitride, or the like. The isolation liners isolate the respective TSVs 26 from semiconductor substrate 22. TSVs 26 and the isolation liners extend from a top surface of semiconductor substrate 22 to an intermediate level between the top surface and the bottom surface of semiconductor substrate 22.

Over substrate 22 may include an Inter-Layer Dielectric (ILD, not shown separately), which fills the space between the gate stacks of transistors in integrated circuit devices 22. In accordance with some embodiments, the ILD may be formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. Contact plugs (not shown) are formed in the ILD, and are used to electrically connect integrated circuit devices 22 to overlying conductive features. In accordance with some embodiments of the present disclosure, the contact plugs are formed of a conductive material selected from tungsten, aluminum, copper, titanium, tantalum, titanium nitride, tantalum nitride, alloys therefore, and/or multi-layers thereof. The formation of the contact plugs may include forming contact openings in the ILD, filling a conductive material(s) into the contact openings, and performing a planarization process (such as Chemical Mechanical Polish (CMP) process or a mechanical grinding process) to level the top surfaces of the contact plugs with the top surface of the ILD.

Interconnect structure 27 is formed over semiconductor substrate 22. Interconnect structure 27 may include the ILD, contact plugs, a plurality of dielectrics layers 28, and metal lines/pads 30 and vias 32 formed in dielectric layers 28. Metal lines/pads 30 and vias 32 are electrically connected to TSVs 26 and the integrated circuits. Dielectric layers 28 may comprise one or more Inter-Metal-Dielectric (IMD) layers. The IMD layers may be formed of low-k dielectric materials having low k values, which may be, for example, lower than about 3.0, or in the range between about 2.5 and about 3.0. The low-k dielectric material may be a carbon-containing low-k dielectric material, Hydrogen SilsesQuioxane (HSQ), MethylSilsesQuioxane (MSQ), or the like. In accordance with alternative embodiments, dielectric layers 28 are formed of or comprise silicon oxide, silicon nitride, silicon carbide, silicon oxynitride, combinations thereof, and/or multi-layers thereof.

Metal lines/pads 30 are formed in dielectric layers 28. Vias 32 are formed in dielectric layers 28 to interconnect metal lines/pads 30. The metal lines/pads 30 in the topmost IMD 28 are also referred to as top metal lines/pads 30T. In accordance with some embodiments, the top metal lines/ pads 30T are the metal lines/pads formed in the topmost inorganic low-k dielectric layers in interconnect structure 27, and the dielectric layer/layers 33 overlying the top metal lines/pads are non-low-k dielectric layers, polymer layers, or the like. For example, the non-low-k dielectric layers 33 may include dielectric layers 33 having k values greater than 3.9, and may be formed of or comprise undoped silicate glass (USG), silicon oxide, silicon nitride, or the like, composite layers thereof, and/or combinations thereof. The dielectric layer/layers 33 may also include polymer layers, which may be formed of or comprise polyimide, polybenzoxazole (PBO), benzocyclobutene (BCB), or the like.

Metal pads 34 may be formed in dielectric layers 33. Immediately above top metal lines/pads 30T, there may be the first (non-low-k) passivation layer, and metal pads 34 may extend into the first passivation layer, with the first passivation layer in contact with the topmost dielectric layer 28 and top metal lines/pads 30T. A second passivation layer may extend on the edges and the top surfaces of metal pads 34. The passivation layers may be formed of silicon oxide, silicon nitride, USG, or the like. Metal pads 34 may be formed of or comprise aluminum, aluminum copper, copper, nickel, or the like. There may be, or may not be, Post Passivation Interconnect (PPI) formed over and connecting to metal pads 34. Dielectric layer 36 is deposited over metal pads 34 as a surface dielectric layer of wafer 20. Dielectric layer 36 may be formed of or comprise PBO, polyimide, silicon oxide, silicon nitride, or the like.

Figure 2:
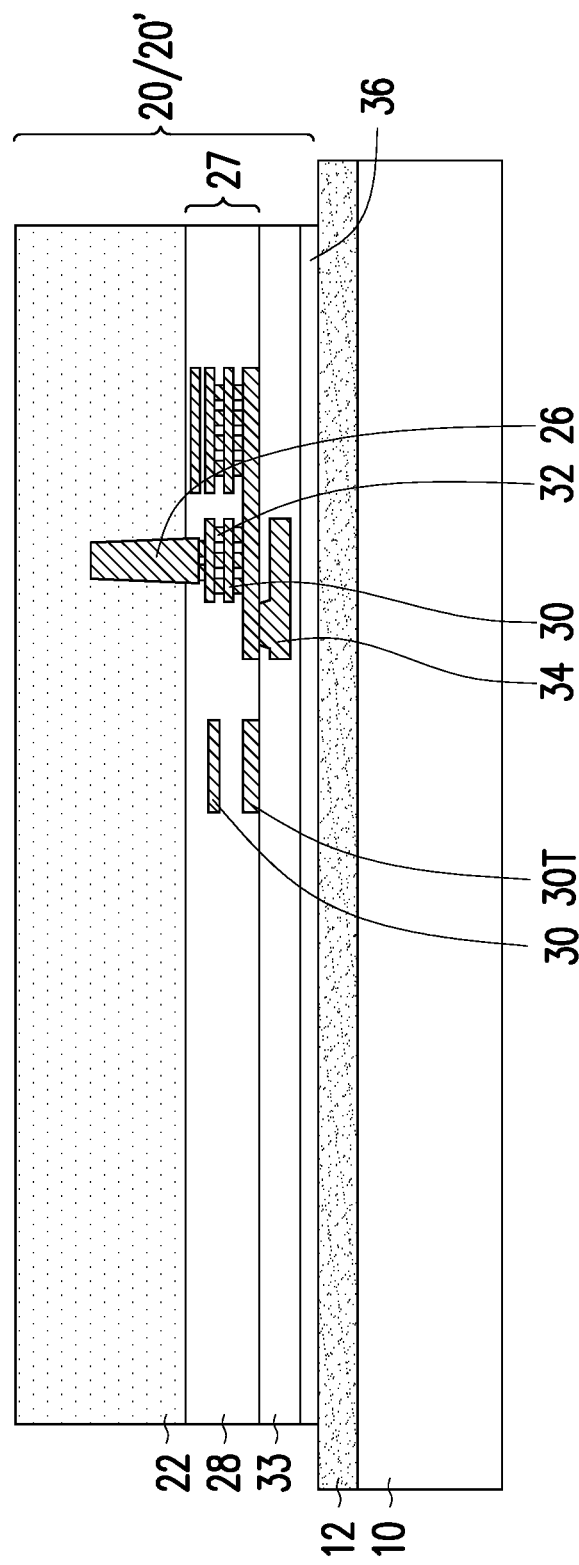
Figure 29:
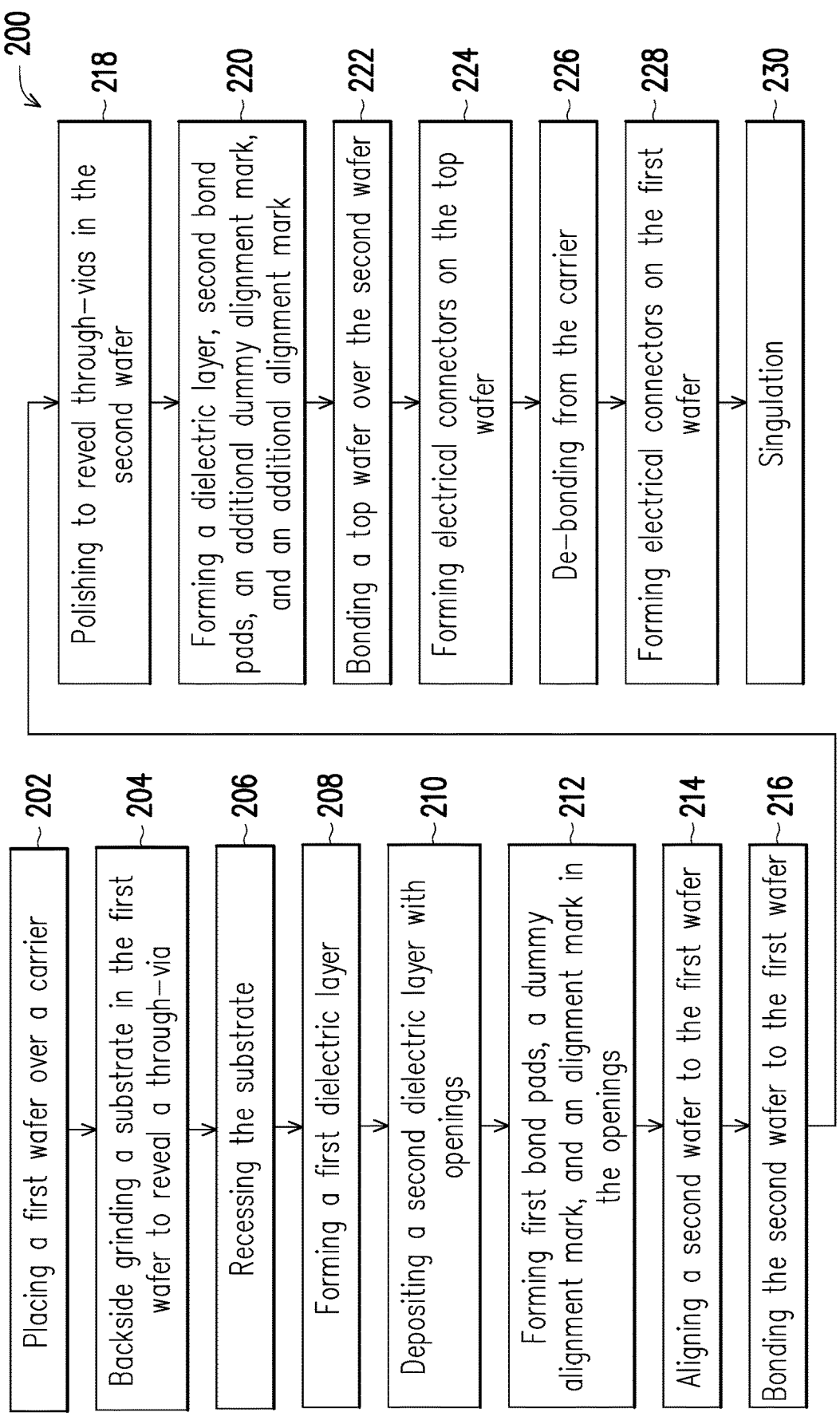
FIG. 29 illustrates a process flow for forming a die stack in accordance with some embodiments.

Referring to FIG. 2, wafer 20 is placed on release film 12, which is further coated on carrier 10. The respective process is illustrated as process 202 in the process flow 200 as shown in FIG. 29. The front side of wafer 20, which is the side of the substrate 22 having the active devices and interconnect structure 27, faces carrier 10 in accordance with some embodiments. In accordance with alternative embodiments, the backside of wafer 20 may face carrier 10 instead. Carrier 10 is formed of a transparent material, and may be a glass carrier, a ceramic carrier, or the like. Release film 12 may be formed of a Light-To-Heat-Conversion (LTHC) coating material. In accordance with some embodiments of the present disclosure, the LTHC coating material is capable of being decomposed under the heat of light/radiation (such as a laser beam), and hence can release carrier 10 from the structure formed thereon. A buffer layer (not shown) may be formed on release film 12, with wafer 20 being placed over the buffer layer. In accordance with some embodiments, the buffer layer may be formed of or comprises a polymer such as polyimide, PBO, BCB, or the like. In accordance with alternative embodiments, the buffer layer is not formed.

Figure 3:
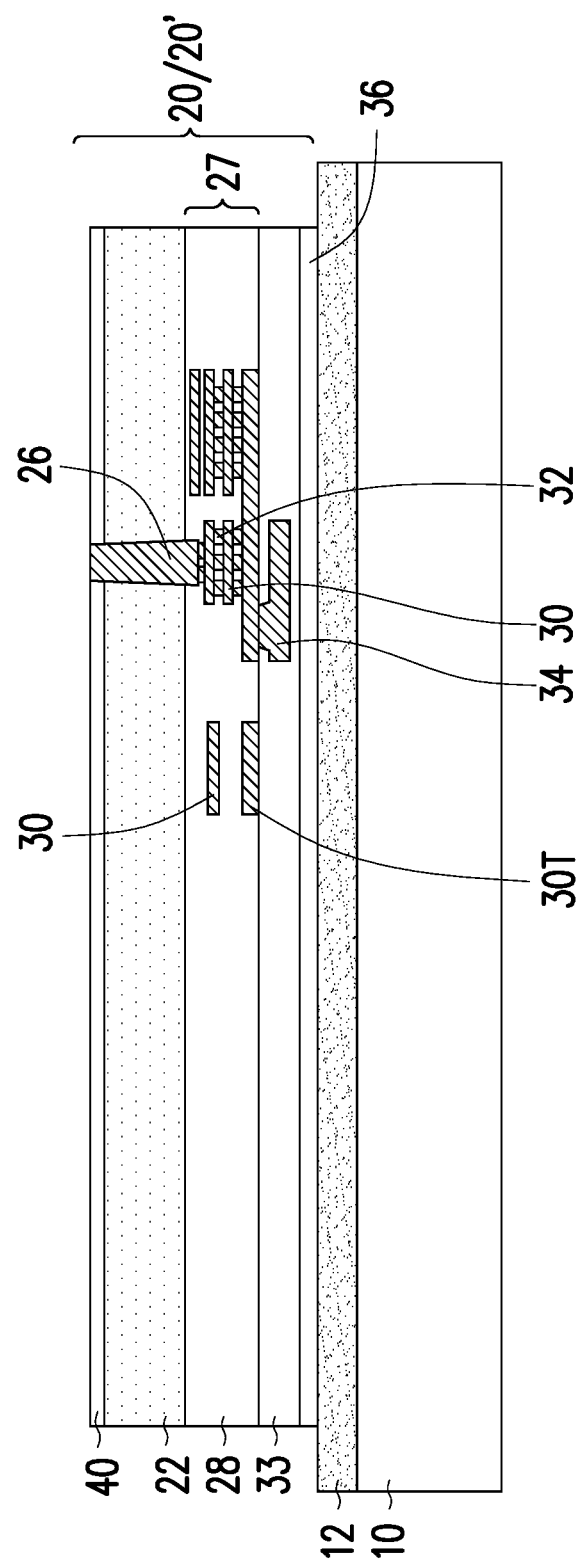

Referring to FIG. 3, a backside grinding process is performed to remove a portion of substrate 22, until throughvias 26 are revealed. The respective process is illustrated as process 204 in the process flow 200 as shown in FIG. 29. Next, as also shown in FIG. 3, substrate 22 may be recessed slightly (for example, through etching), so that the top portions of through-vias 26 protrude out of the back surface of substrate 22. The respective process is illustrated as process 206 in the process flow 200 as shown in FIG. 29. Next, a dielectric layer 40 is deposited, followed by a planarization process such as a Chemical Mechanical Polish (CMP) process or a mechanical grinding process to re-expose through-vias 26, forming the structure shown in FIG. 4. The respective process is illustrated as process 208 in the process flow 200 as shown in FIG. 29. In the resulting structure, through-vias 26 penetrate through both of substrate 22 and dielectric layer 40. In accordance with some embodiments, dielectric layer 40 is formed of or comprises silicon oxide, silicon nitride, silicon carbide, silicon oxycarbide, or the like.

Figure 4:
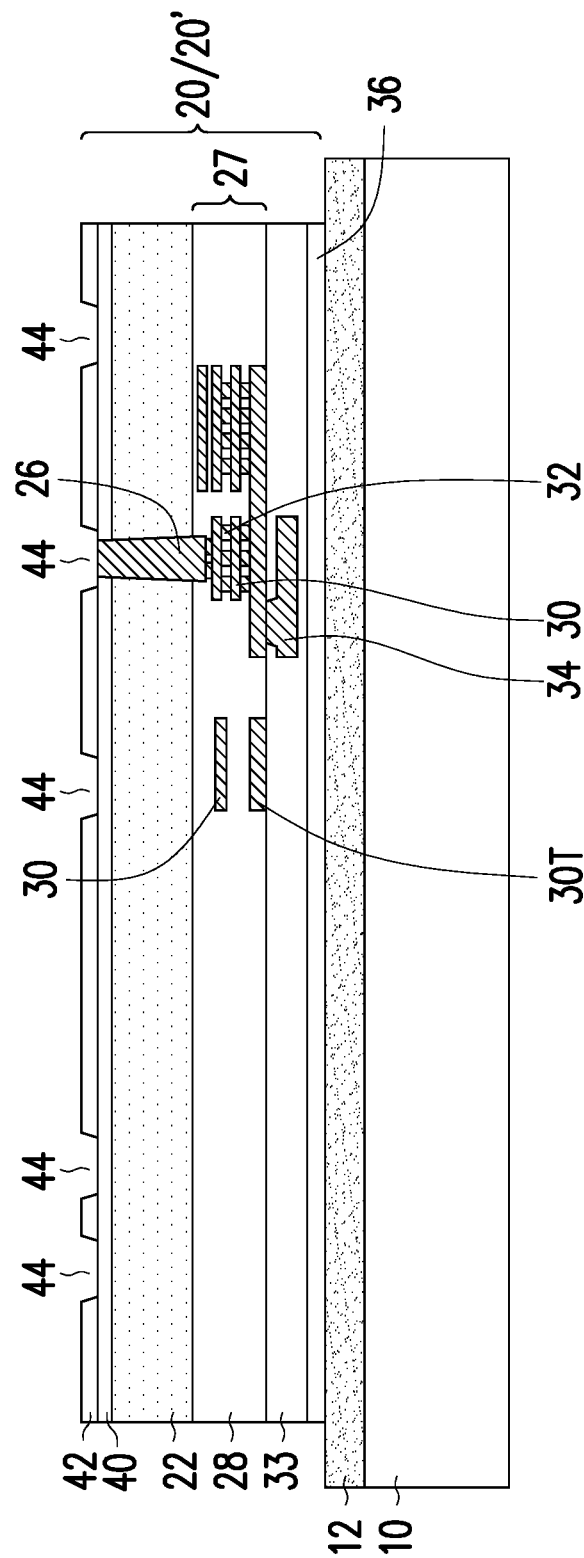
Figure 5:
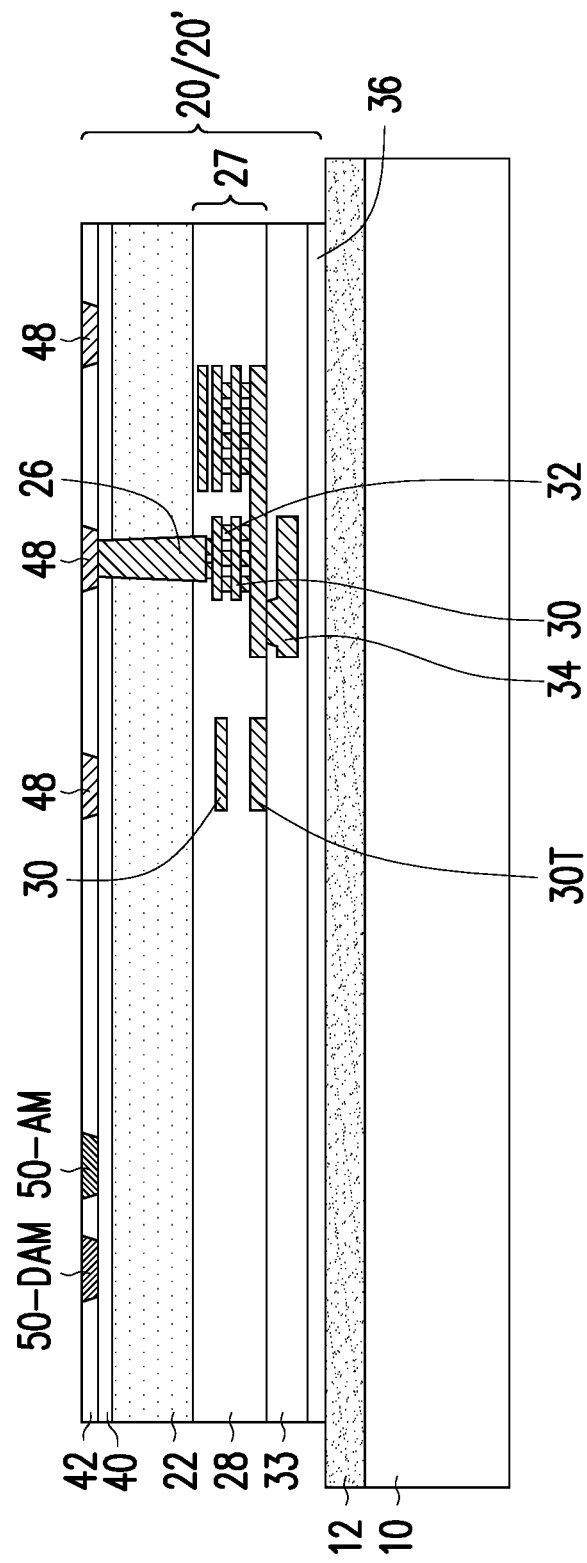

Referring to FIG. 4, dielectric layer 42 is deposited. The respective process is illustrated as process 210 in the process flow 200 as shown in FIG. 29. In accordance with some embodiments, as shown in FIG. 5, dielectric layer 42 is in contact with dielectric layer 40 and through-vias 26, and there is no additional dielectric layer and redistribution lines (RDLs) in between. In accordance with alternative embodiments of the present disclosure, there may be one or a plurality of dielectric layers between dielectric layers 40 and 42. There may also be one or a plurality of layers of RDLs in the dielectric layers, which RDLs are electrically connected to through-vias 26. Dielectric layer 42 may comprise or may be formed of a silicon-containing dielectric material such as silicon oxide, silicon nitride, silicon oxynitride, silicon oxycarbide, silicon oxycarbonitride, or the like. In the illustrated example, the subsequently formed bond pads and alignment marks are formed through a single damascene process. In accordance with alternative embodiments, dual damascene processes are adopted, and vias are also formed underlying and connecting the subsequently formed bond pads to through-vias 26.

Further referring to FIG. 4, openings 44 are formed in dielectric layer 42. To form openings 44, a photo resist (not shown) and possibly a hard mask (not shown) may be formed over dielectric layer 42, and are patterned to define the patterns of openings 44. In accordance with some embodiments of the present disclosure, an anisotropic etching process is performed to etch dielectric layer 42, and to form openings 44. In accordance with some embodiments in which no RDLs are formed over through-vias 26, through-vias 26 are exposed to openings 44. In accordance with alternative embodiments in which RDLs are formed, the RDLs are exposed to openings 44.

Figure 27:
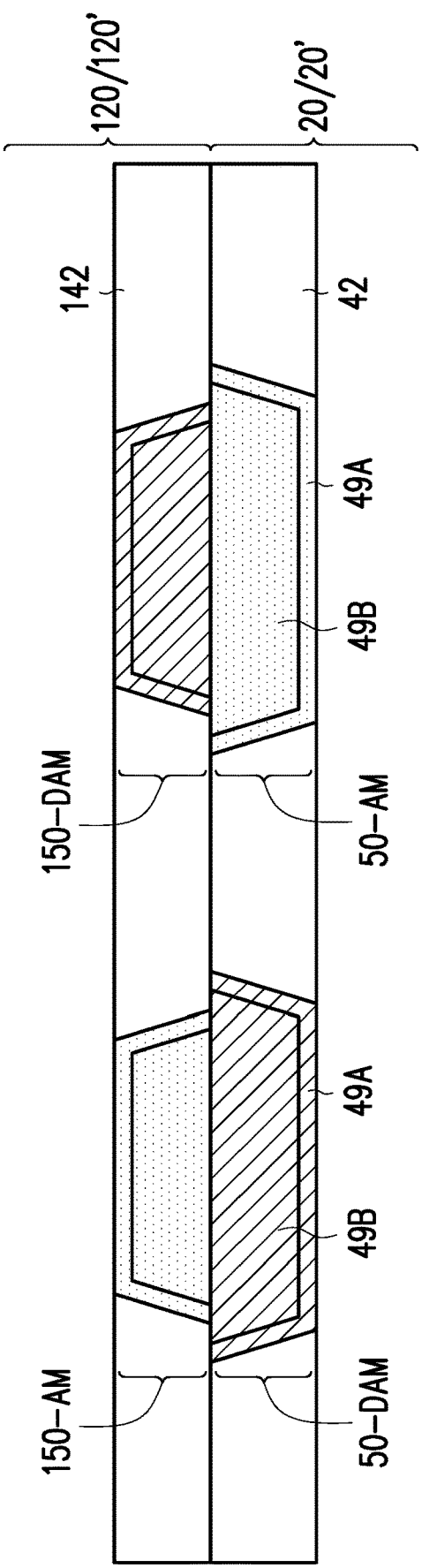
FIG. 27 illustrates an embodiment in which an alignment mark and the corresponding dummy alignment mark have different sizes in accordance with some embodiments.
Figure 28:
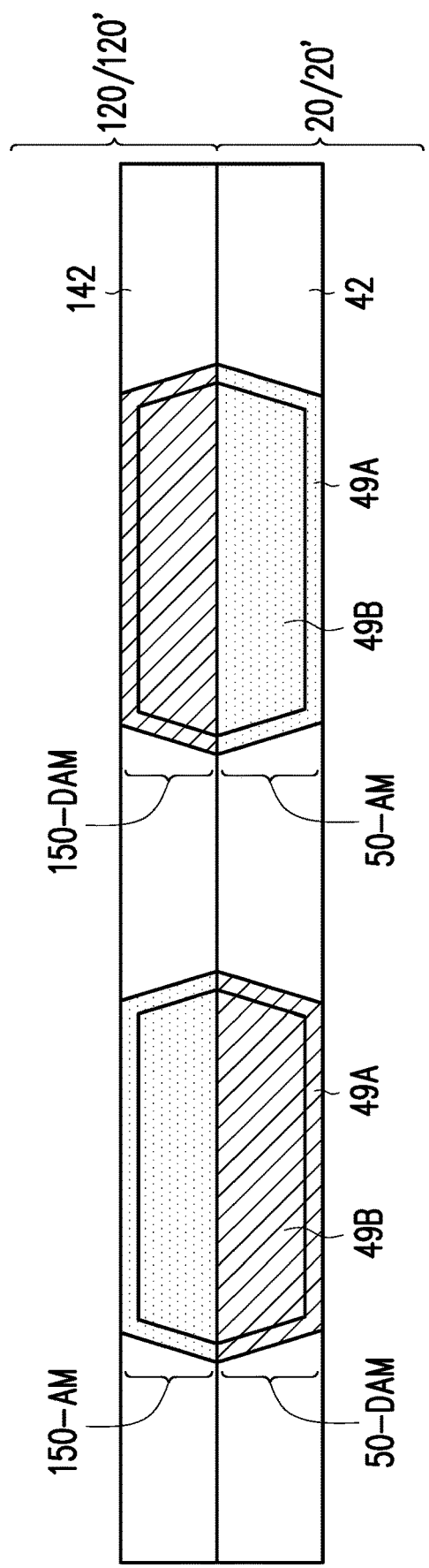
FIG. 28 illustrates an embodiment in which an alignment mark and the corresponding dummy alignment mark have a same size in accordance with some embodiments.

FIG. 5 illustrates the formation of bond pads 48, alignment mark 50-AM, and dummy alignment mark 50-DAM. The respective process is illustrated as process 212 in the process flow 200 as shown in FIG. 29. The formation process may include depositing a diffusion barrier, depositing a conductive material (metallic material) over the diffusion barrier, and performing a planarization process to remove excess diffusion barrier layer and conductive material. In accordance with some embodiments of the present disclosure, the diffusion barrier is formed of titanium, titanium nitride, tantalum, tantalum nitride, or the like. The diffusion barrier may be formed, for example, using Atomic Layer Deposition (ALD), Physical Vapor Deposition (PVD), or the like. The metallic material may be deposited, for example, through an Electro-Chemical Plating (ECP) process. The metallic material may include copper or copper alloy, tungsten, aluminum, silver, alloys thereof, or another metallic material that can diffuse in a subsequent anneal process, so that metal-to-metal direct bonding may be formed. Bond pads 48, alignment mark 50-AM, and dummy alignment mark 50-DAM are thus formed in surface dielectric layer 42. The diffusion barrier layer in each of bond pads 48, alignment mark 50-AM, and dummy alignment mark 50-DAM may have the shape of a basin, and the metallic material is located in the basin. For example, as shown in FIGS. 27 and 28, each of alignment mark 50-AM, and dummy alignment mark 50-DAM includes diffusion barrier 49A and metallic material 49B. In a top view, the diffusion barriers may encircle the metallic materials in the corresponding bond pads 48, alignment mark 50-AM, and dummy alignment mark 50-DAM. It is appreciated that the electrical connection of some of bond pads 48 to the corresponding through-vias 26 are not shown, while these electrical connections are also shown.

In accordance with some embodiments, alignment mark 50-AM and dummy alignment mark 50-DAM are electrically floating, and all materials (such as dielectric layers 40 and 42) underlying and contacting alignment mark 50-AM and dummy alignment mark 50-DAM may be dielectric materials. Furthermore, all materials surrounding and contacting each of alignment mark 50-AM and dummy alignment mark 50-DAM may be dielectric materials. In accordance with alternative embodiments, some or all of alignment mark 50-AM and dummy alignment mark 50-DAM may be connected to through-vias for connecting to electrical ground, power supply voltage VDD, or signal lines.

The wafer 20 may be used to perform the subsequently discussed bonding process at wafer level, wherein a wafer-to-wafer bonding is performed as an example. In accordance with alternative embodiments, a singulation process is performed to saw wafer 20 apart, so that dies 20' are separated into discrete dies. The discrete dies 20' are then used to form die stacks at die level. In the subsequent discussion, the wafer-to-wafer bonding is used as an example, and the die-to-die bonding are also in the scope of the present disclosure. The corresponding wafer 20 or die 20' are also referred to as package components to indicate that wafers/dies are example, while the present disclosure also apply to the bonding of other types of package components such as packages.

Figure 6:
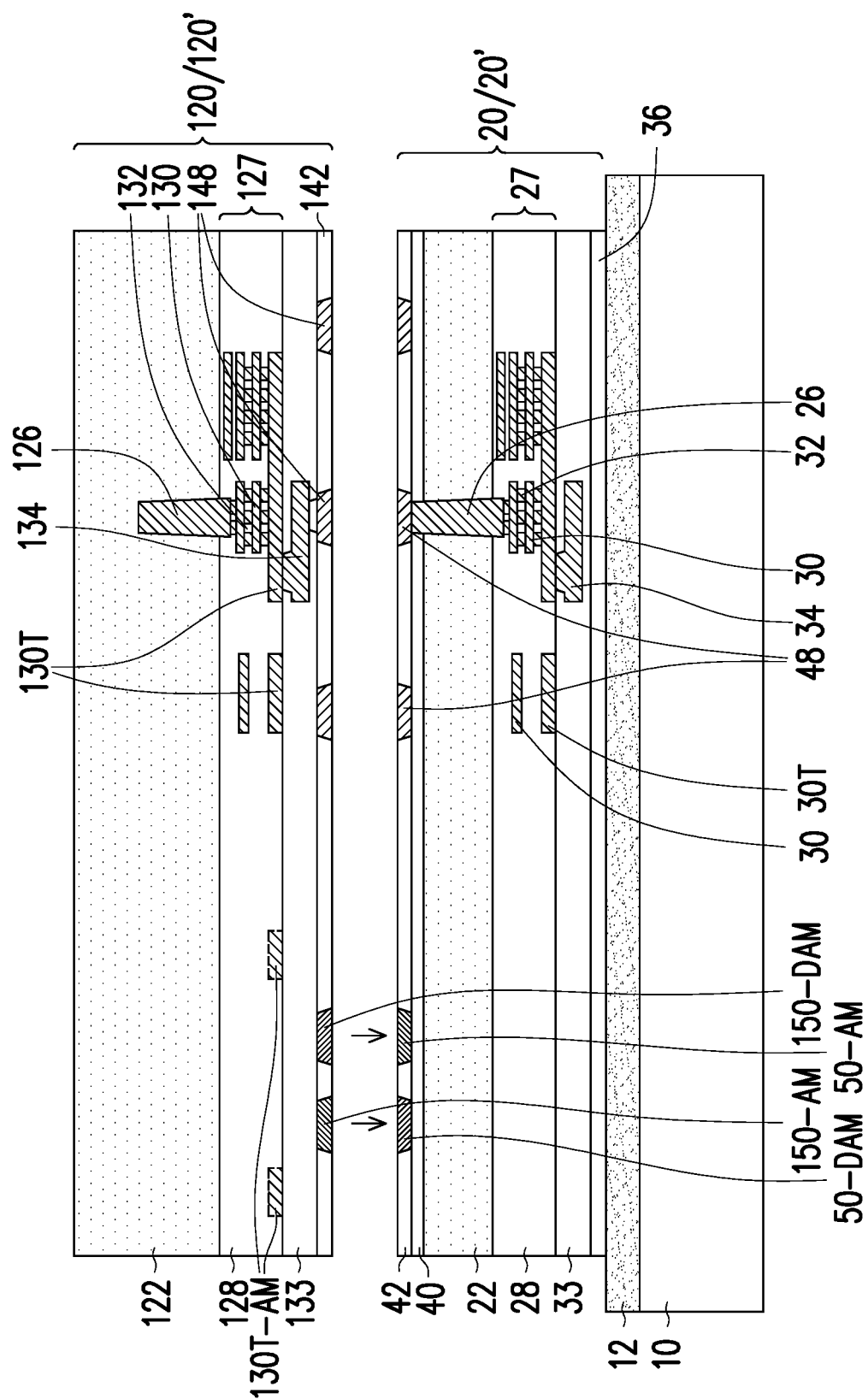

Referring to FIG. 6, package component 120 is provided. Package component 120 may also be a wafer, which may include dies 120' therein. Package component 120 may be a device wafer, an interposer wafer, a reconstructed wafer, or the like. In subsequent discussion, a device wafer is used as an example, while the discussion may also be applied to other types of package components. As aforementioned, the bonding may also be at die level, and hence package component 120' may also be a discrete die.

In accordance with some embodiments, wafer 120 includes similar features as what have been discussed for wafer 20. The like features in wafer 120 may be identified by adding "100" to the feature numbers of the corresponding features in wafer 20. For example, wafer 120 may include substrate 122, through-vias 126, metal lines/pads 130, top metal lines/pads 130T, vias 132, dielectric layers 128 and 133, metal pads 134, surface dielectric layer 142, bond pads 148, alignment mark 150-AM, and dummy alignment mark 150-DAM. Unless specified otherwise, the formation processes and the materials of the features in wafer 120 may be similar to that of their corresponding features in wafer 20, and the details are not repeated herein. It is appreciated, however, the circuits and structures in wafer 120 may be the same as (except the alignment marks and dummy alignment marks) or different from what are in wafer 20.

Figure 15:
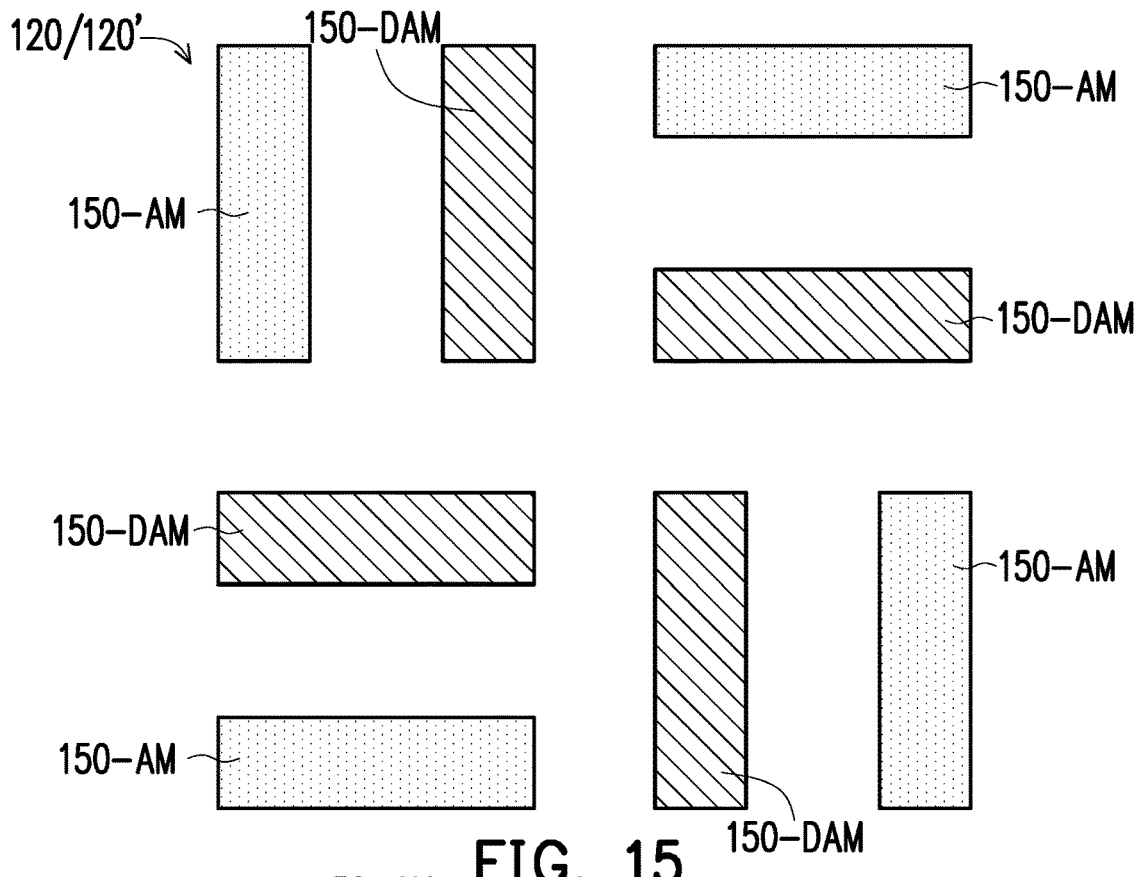
FIGS. 15, 16, and 17 illustrate top views of alignment marks and dummy alignment marks of a first-tier package component, a second-tier package component, and the bonded package components in accordance with some embodiments.

FIG. 15 illustrates an example top view of alignment mark 150-AM and dummy alignment mark 150-DAM in wafer 120 (as shown in FIG. 6) in accordance with some embodiments. It is appreciated that the patterns of the illustrated alignment marks and dummy alignment marks throughout the description are examples, and the alignment marks and dummy alignment marks may have any applicable arrangements and shapes. Alignment mark 150-AM may include one or a plurality of features (which are also referred to as patterns), which are formed in the same formation process as forming bond pads 148 (FIG. 6). The formation processes and the materials may be similar to that of bond pads 48, as above-discussed. The plurality of features in alignment mark 150-AM collectively form a pattern that may be recognized by an aligner, which may be a part of a bonding apparatus for bonding wafer 120 to wafer 20. Dummy alignment mark 150-DAM also includes a plurality of features, which are formed in the same formation process as for forming bond pads 148 (FIG. 6) and alignment mark 150-AM. Throughout the description, when the term "alignment mark" or "dummy alignment mark" is used, it may refer to the features collectively, or the individual features inside the collective pattern, depending on the context. It is appreciated that although alignment mark 150-AM and dummy alignment mark 150-DAM are located in the same chip area, the aligner searches for, and recognizes the pattern of, alignment mark 150-AM, while the pattern of dummy alignment mark 150-DAM is not searched for by the aligner. Rather, the features in dummy alignment mark 150-DAM are treated by the aligner as environmental features or a background pattern. Accordingly, dummy alignment mark 150-DAM is a "dummy" alignment mark since it does not have the function of being used for aligning purpose, even if it may intermix with alignment mark 150-AM.

Figure 16:
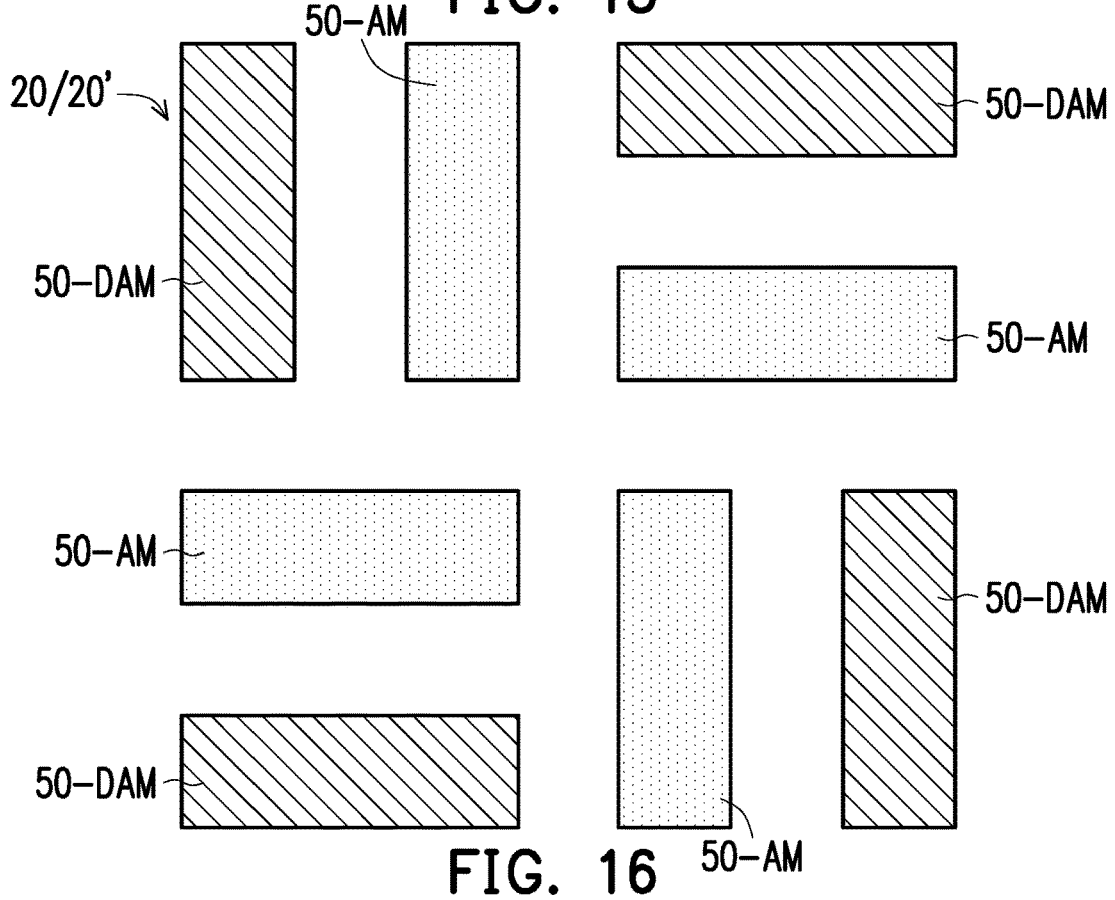

FIG. 16 illustrates an example top view of alignment mark 50-AM and dummy alignment mark 50-DAM in wafer 20 (FIG. 6) in accordance with some embodiments. Alignment mark 50-AM may also include one or a plurality of features, which are formed in the same formation process as for forming bond pads 48 (FIGS. 4 and 5). The plurality of features in alignment mark 50-AM collectively form a pattern that may be recognized by the aligner, which may be a part of the bonding apparatus. Dummy alignment mark 50-DAM may also include a plurality of features, which are formed in the same formation process as bond pads 48 and alignment mark 50-AM. It is appreciated that although alignment mark 50-AM and dummy alignment mark 50-DAM are located in the same chip area, the aligner searches for, and recognizes the pattern of, alignment mark 50-AM, while the pattern of dummy alignment mark 50-DAM is not searched for by the aligner. Rather, the features of dummy alignment mark 50-DAM are treated by the aligner as environmental pattern or a background pattern. Accordingly, dummy alignment mark 50-DAM is a "dummy" alignment mark since it does not have the function of being used for aligning purpose.

Referring back to FIG. 6, the aligner of the bonding instrument searches and recognizes the pattern of alignment mark 50-AM of wafer 20. The aligner of the bonding instrument also searches and recognizes the pattern of alignment mark 150-AM of wafer 120. With the relative positions of wafers 20 and 120 known, an alignment process may be performed to align wafer 120 to wafer 20. The respective process is illustrated as process 214 in the process flow 200 as shown in FIG. 29.

Figure 7:
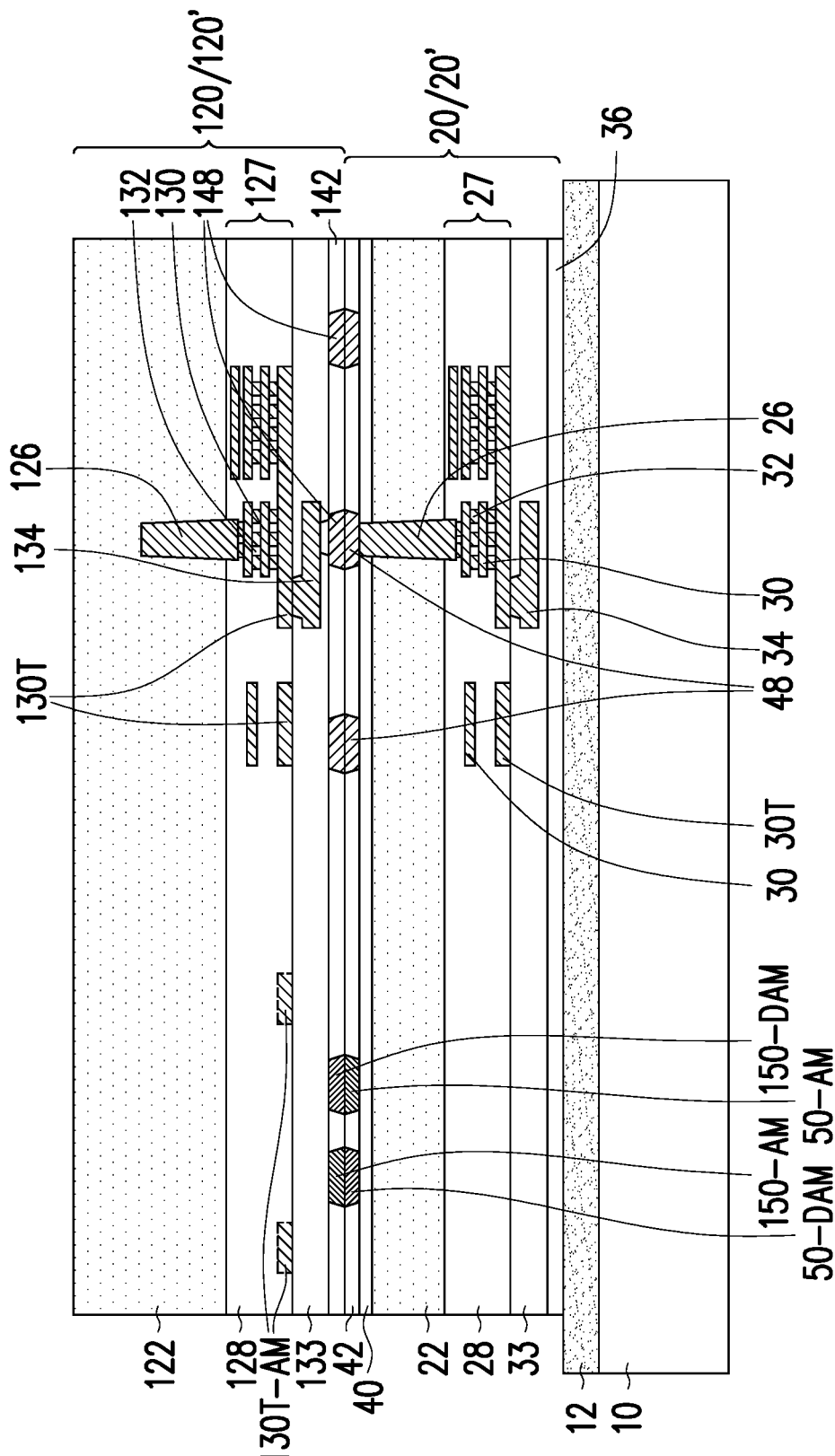

Referring to FIG. 7, with wafer 120 being aligned to wafer 20, a bonding process is performed to bond wafer 120 to wafer 20. The respective process is illustrated as process 216 in the process flow 200 as shown in FIG. 29. The bonding process may be performed through hybrid bonding. Accordingly, the surface dielectric layer 142 in wafer 120 is bonded to the surface dielectric layer 42 in wafer 20 through fusion bonding, for example, with Si—O—Si bonds formed between surface dielectric layer 142 and surface dielectric layer 42. Alignment mark 150-AM are bonded to the respective dummy alignment mark 50-DAM through metal-to-metal bonding (with metal inter-diffusion), and dummy alignment mark 150-DAM are bonded to alignment mark 50-AM through metal-to-metal bonding (with metal inter-diffusion).

Figure 17:
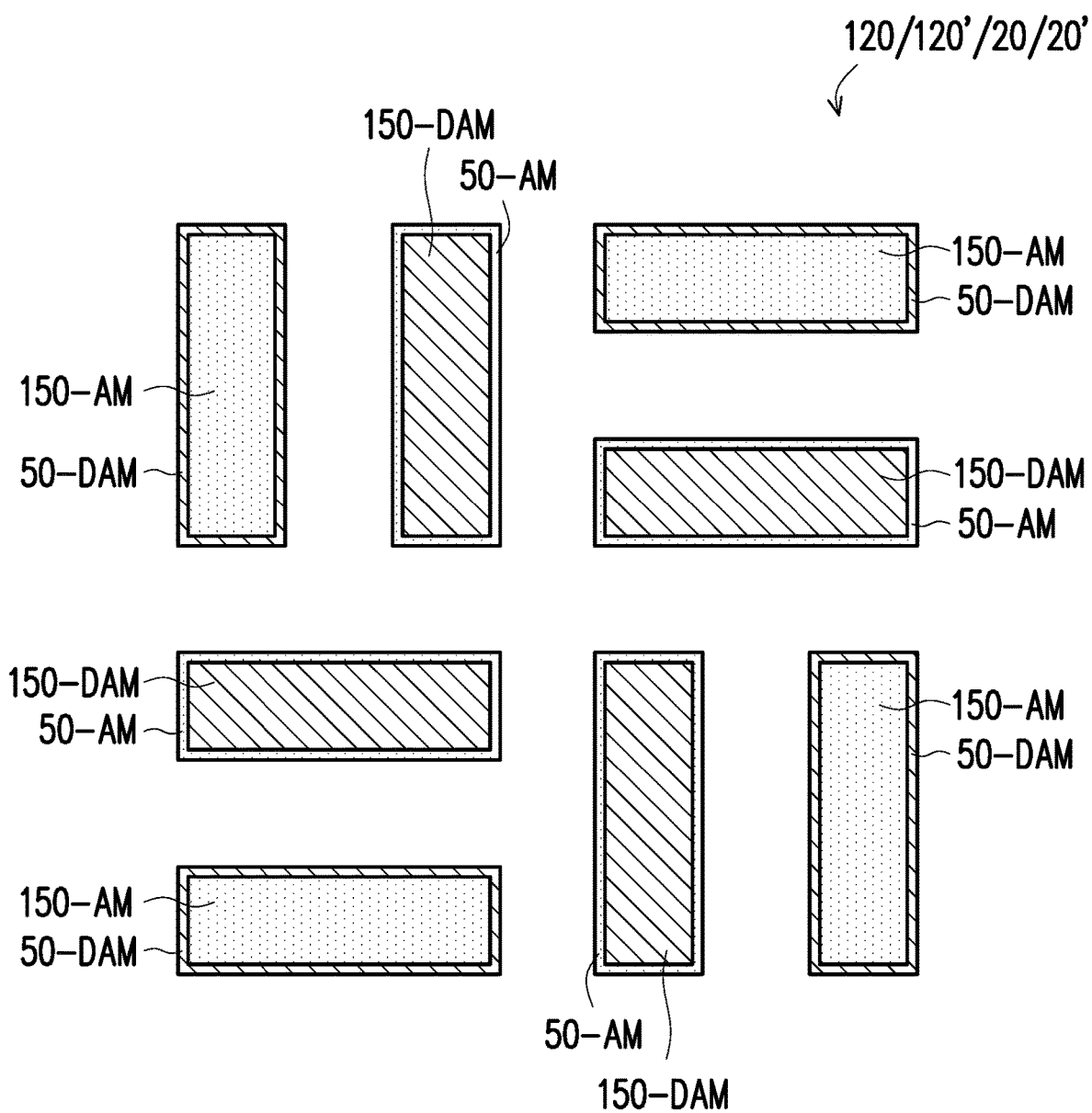

FIG. 17 illustrates a top view of the bonded alignment mark 50-AM, dummy alignment mark 50-DAM, alignment mark 150-AM, and dummy alignment mark 150-DAM in accordance with some embodiments. The features/patterns in alignment mark 150-AM overlap and bond to the corresponding features/patterns in dummy alignment mark 50-DAM in a one-to-one correspondence. The features/patterns in dummy alignment mark 150-DAM overlap and bond to the features/patterns in alignment mark 50-AM in a one-to-one correspondence. In accordance with some embodiments, there may not be any alignment mark 50-AM overlapping and bonding to alignment mark 150-AM, and there may not be any alignment mark 150-AM underlying and bonding to alignment mark 50-AM. In accordance with alternative embodiments, some, but not all, of the features/patterns in alignment mark 150-AM overlap some, but not all, the features/patterns in alignment mark 50-AM, while there are still some other features/patterns in alignment mark 150-AM overlapping some of the features/patterns in alignment mark 50-AM, and there are still some features/patterns in alignment mark 50-AM underlying some of the features/patterns in dummy alignment mark 150-DAM.

In accordance with some embodiments, alignment mark 150-AM, dummy alignment mark 150-DAM, alignment mark 50-AM, and dummy alignment mark 50-DAM are electrically floating (when the respective final package is used and powered up). In accordance with alternative embodiments, some or all of alignment mark 150-AM, dummy alignment mark 50-AM, alignment mark 150-AM, and dummy alignment mark 50-AM may be connected to electrical ground, power supply voltage VDD, and/or signal lines in any combinations, while the rest (if any) are electrically floating.

Figure 8:
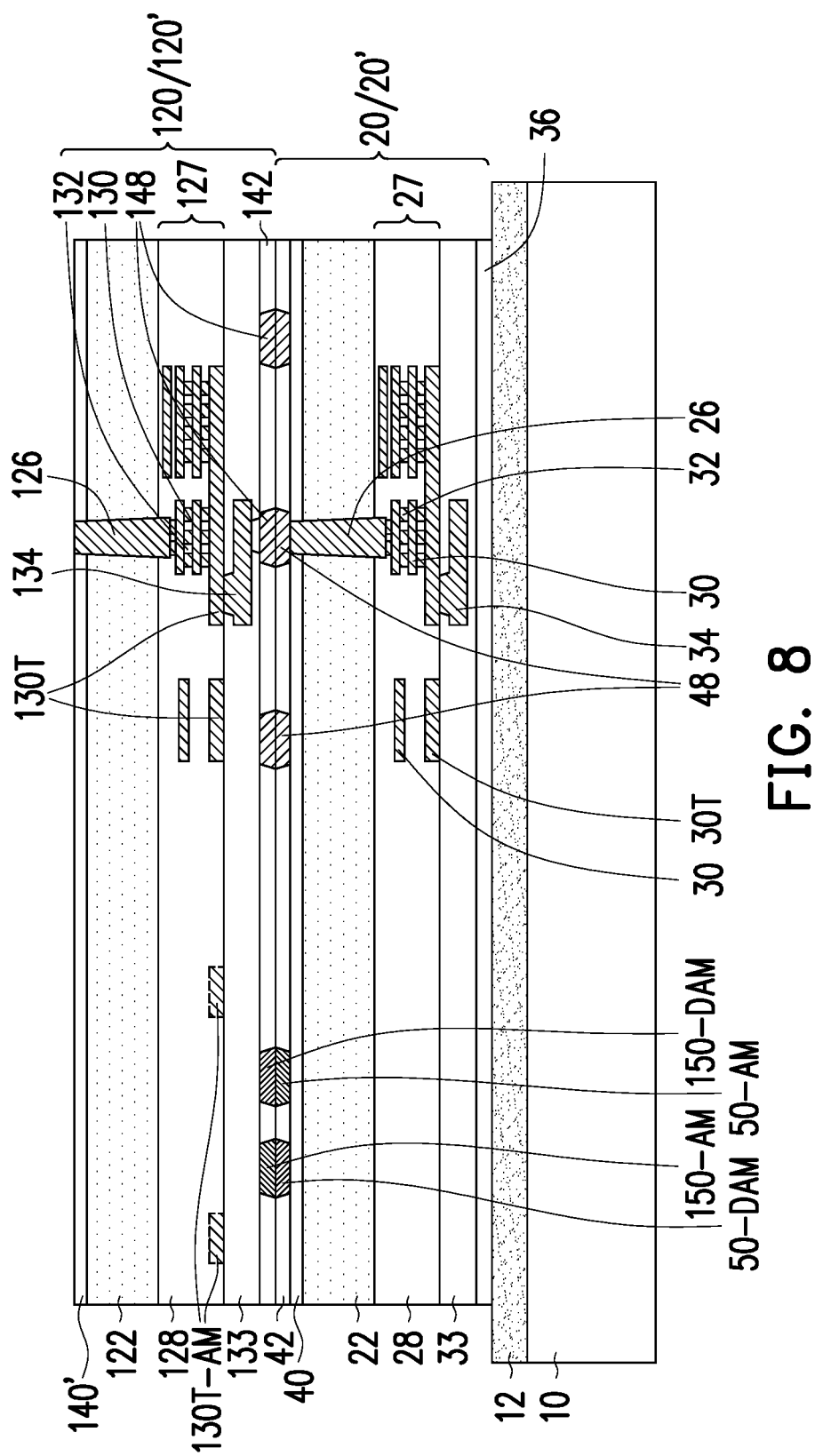

Referring to FIG. 8, a backside grinding process is performed on the backside of substrate 122, so that through-vias 126 are exposed. The respective process is illustrated as process 218 in the process flow 200 as shown in FIG. 29. Next, substrate 122 is recessed slightly (for example, through etching), so that the top portions of through-vias 126 protrude out of the back surface of substrate 122. Next, a dielectric layer 140' is deposited, followed by a planarization process such as a CMP process or a mechanical grinding process to re-expose through-vias 26.

Figure 9:
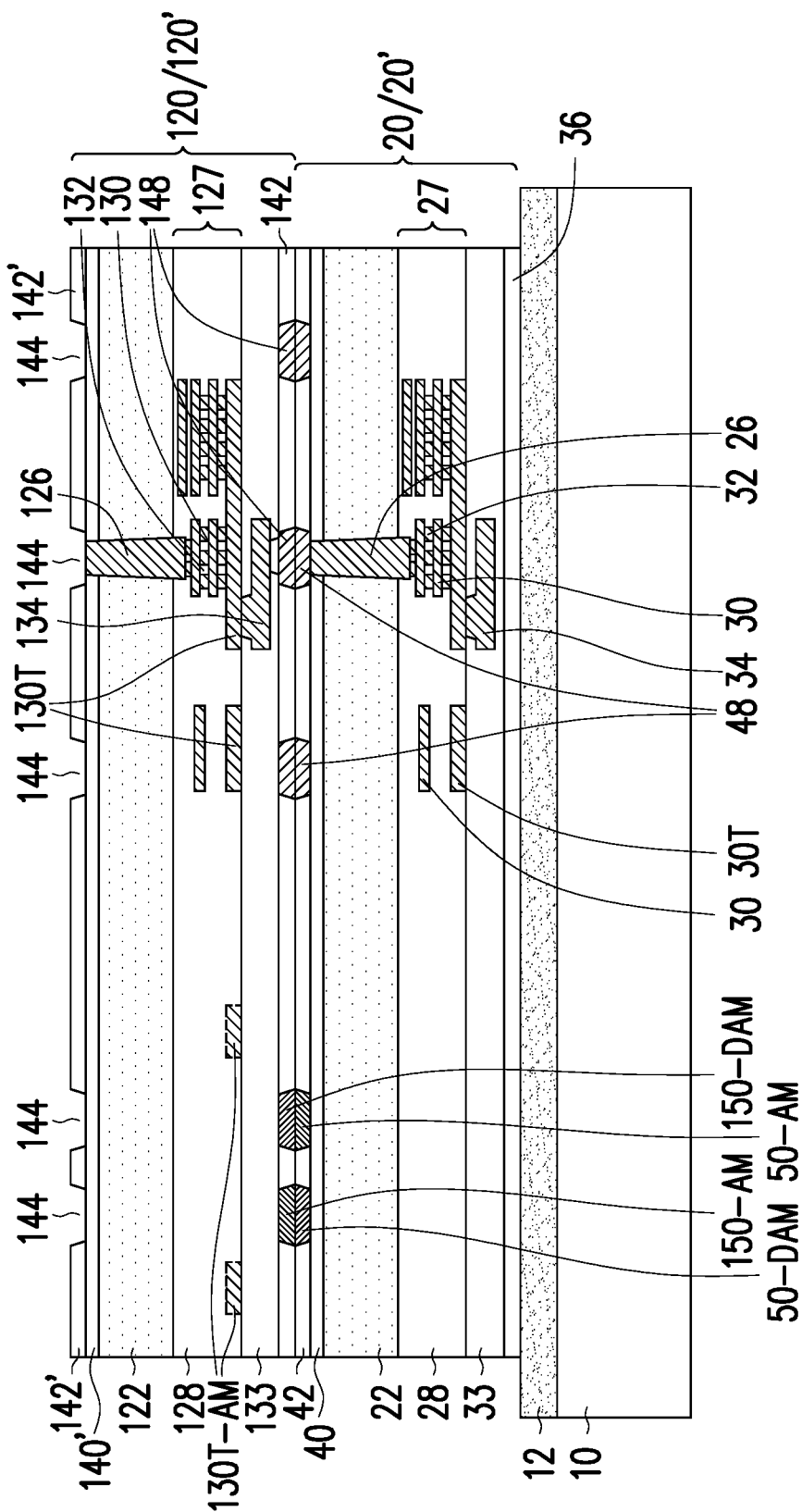
Figure 10:
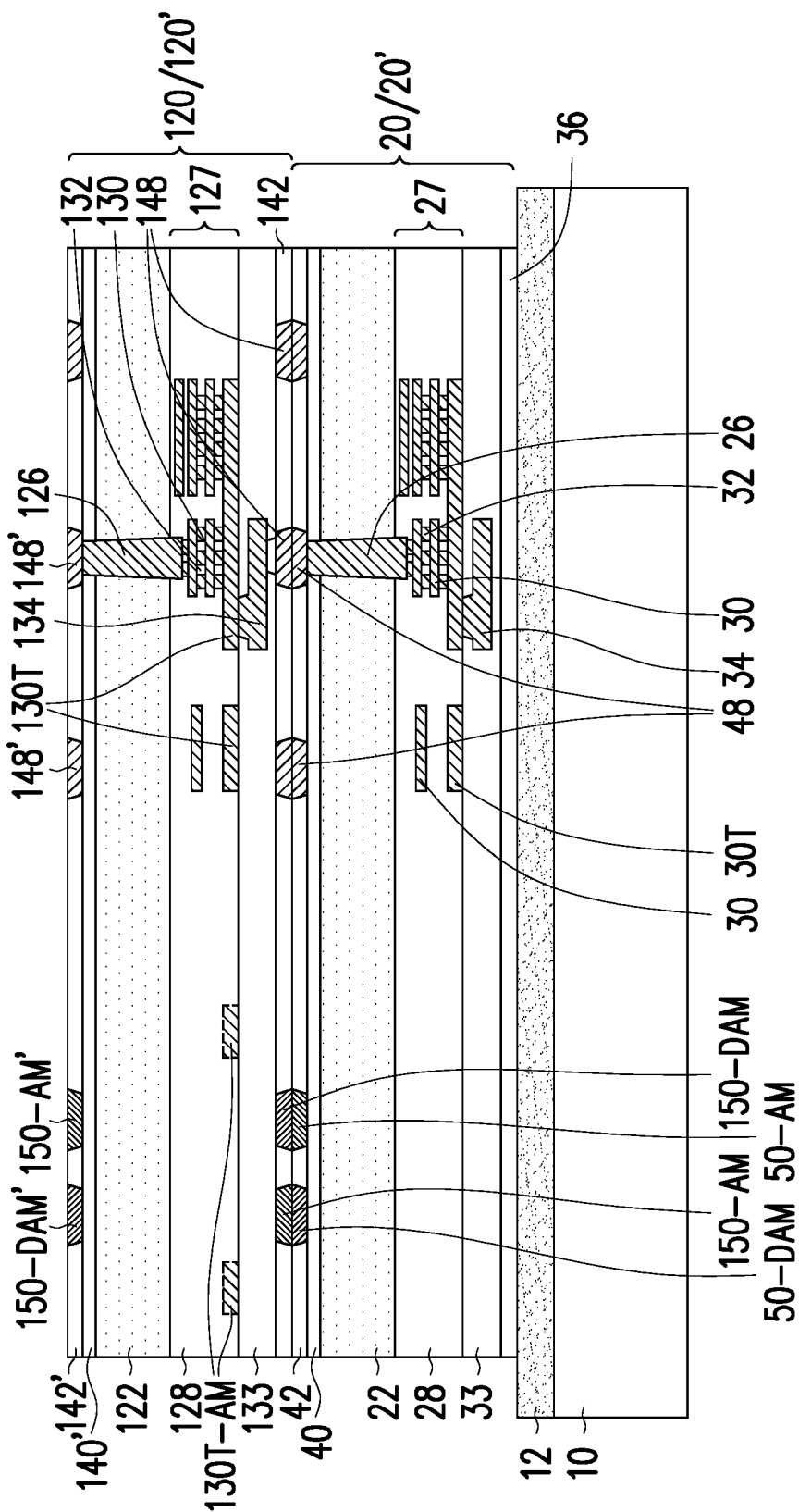

Referring to FIG. 9, dielectric layer(s) 142' is deposited. Additional dielectric layers and RDLs (not shown) may be, or may not be, formed between dielectric layer 142' and substrate 122. A patterning process is then performed to form openings 144 in dielectric layer(s) 142'. In subsequent processes, as shown in FIG. 10, dummy alignment mark 150-DAM' and alignment mark 150-AM' are formed. The respective process is illustrated as process 220 in the process flow 200 as shown in FIG. 29. The structures, materials, and formation processes may be essentially the same as dummy alignment mark 50-DAM' and alignment mark 150-AM'.

Figure 11:
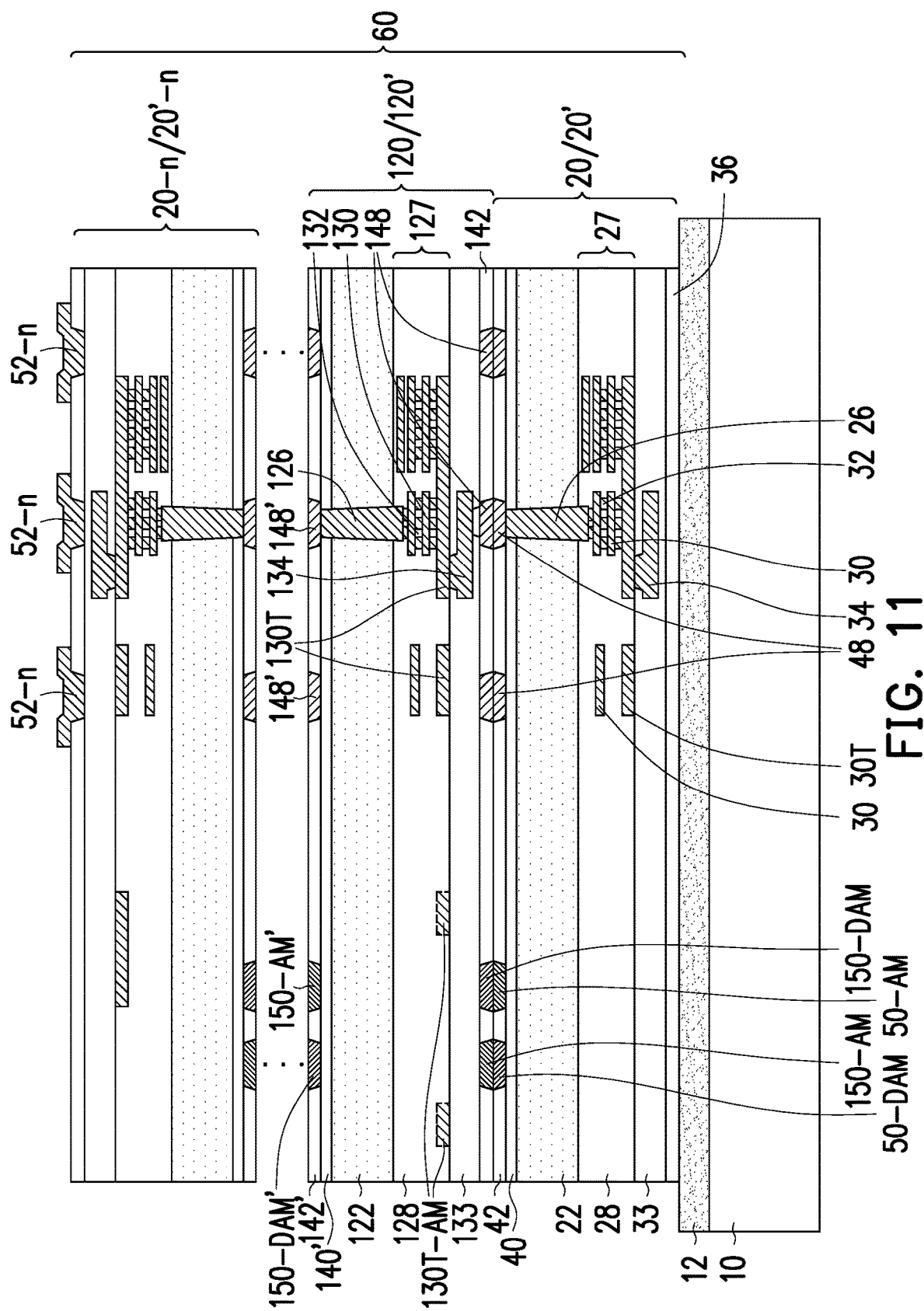

FIG. 11 illustrates the stacking of more wafers (if any) over wafer 120 in accordance with some embodiments until a top wafer is bonded. The respective process is illustrated as process 222 in the process flow 200 as shown in FIG. 29. In accordance with alternative embodiments, no more wafer (or die) is bonded over wafer 120 (or die 120'). The bonding processes may be performed using alignment marks, which are bonded to dummy alignment marks, similar to the bonding of underlying wafers/dies. The top wafer is identified as 20-$n$, with the sequence number n being 2 or greater, indicating that there are two wafers (wafers 20 and 120, with n being equal to 2) or up to n wafers stacked together.

In the previous illustrated bonding of wafer 120 to wafer 20, a face-to-back bonding is illustrated as an example, while the bonding of any wafer to the underlying wafer may also be a face-to-face bonding or a back-to-back bonding. For example, FIG. 11 illustrates that wafer 20-n has its back surface facing the underlying wafer stack (die stack), so the corresponding bonding will be either back-to-face bonding or back-to-back bonding, depending on the orientation of the immediate underlying wafer/die.

FIG. 11 also illustrates the formation of Under-Bump-Metallurgies (UBMs) 52-n. Each of UMBs 52-n may include a barrier layer (such as a titanium layer) and a metal layer (comprising copper, aluminum, nickel, palladium, or the like) over the titanium layer. The formation process may include etching a surface dielectric layer of the top wafer 20-n to form openings, and depositing the barrier layer and the metal layer, for example, using PVD. The deposited titanium layer and the copper layer are patterned to form the UBMs 52-n as illustrated.

Figure 12:
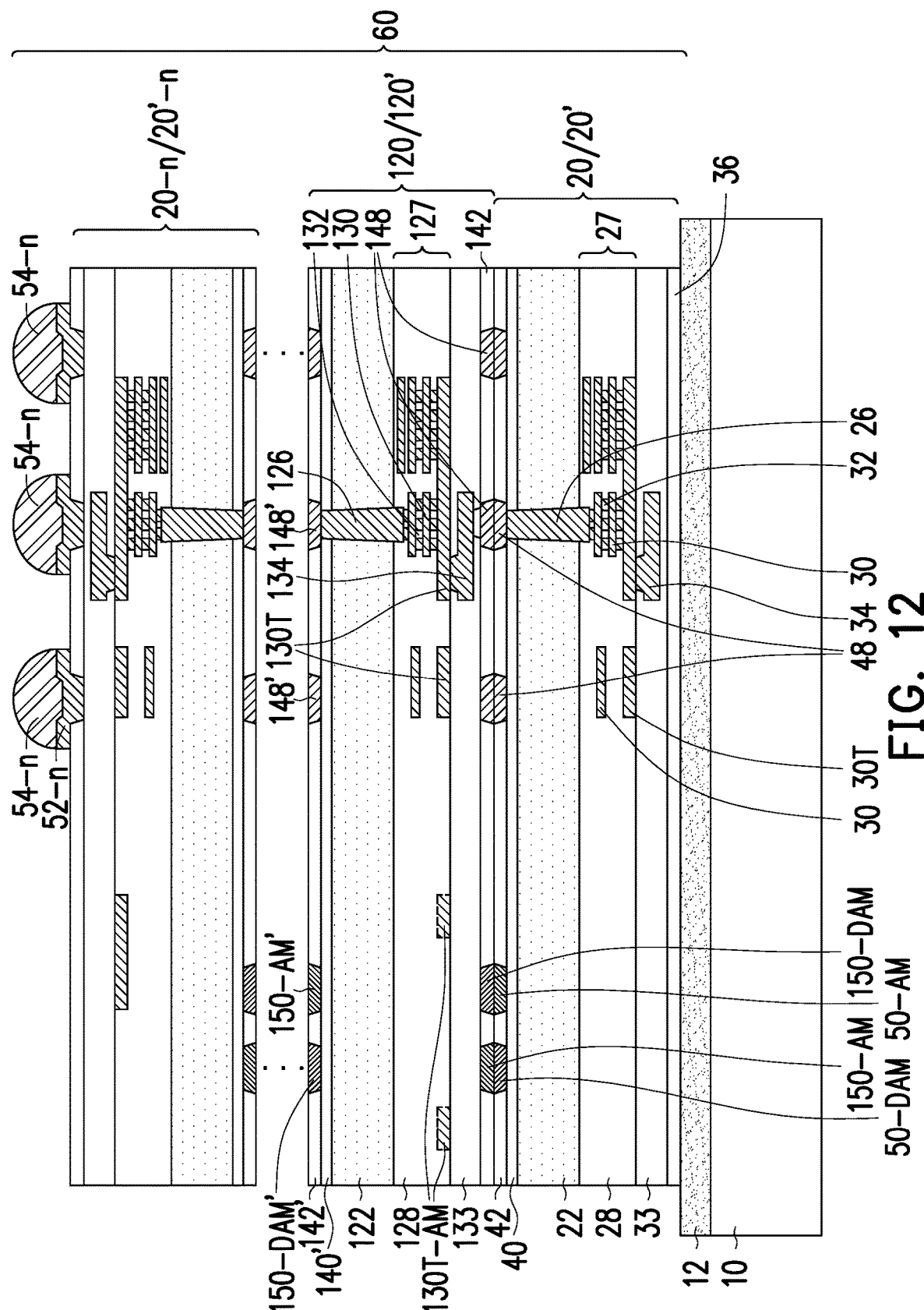

FIG. 12 illustrates the formation of electrical connectors 54-n, each may be formed of or comprise a metal pillar such as a copper pillar, a solder region, or a metal pillar and a solder layer on the copper pillar. The respective process is illustrated as process 224 in the process flow 200 as shown in FIG. 29. The formation process may include placing solder balls on UBMs 52-n, and then performing a reflow process to reflow the solder balls. Alternatively, the formation of UBMs 52-n and electrical connectors 54-n may include depositing a metal seed layer, forming a patterned plating mask over the metal seed layer, plating electrical connectors 54-n in the openings in the plating mask, removing the plating mask, and etching the metal seed layer. Throughout the description, the stacked wafers are collectively referred to as a wafer stack 60.

Figure 13:
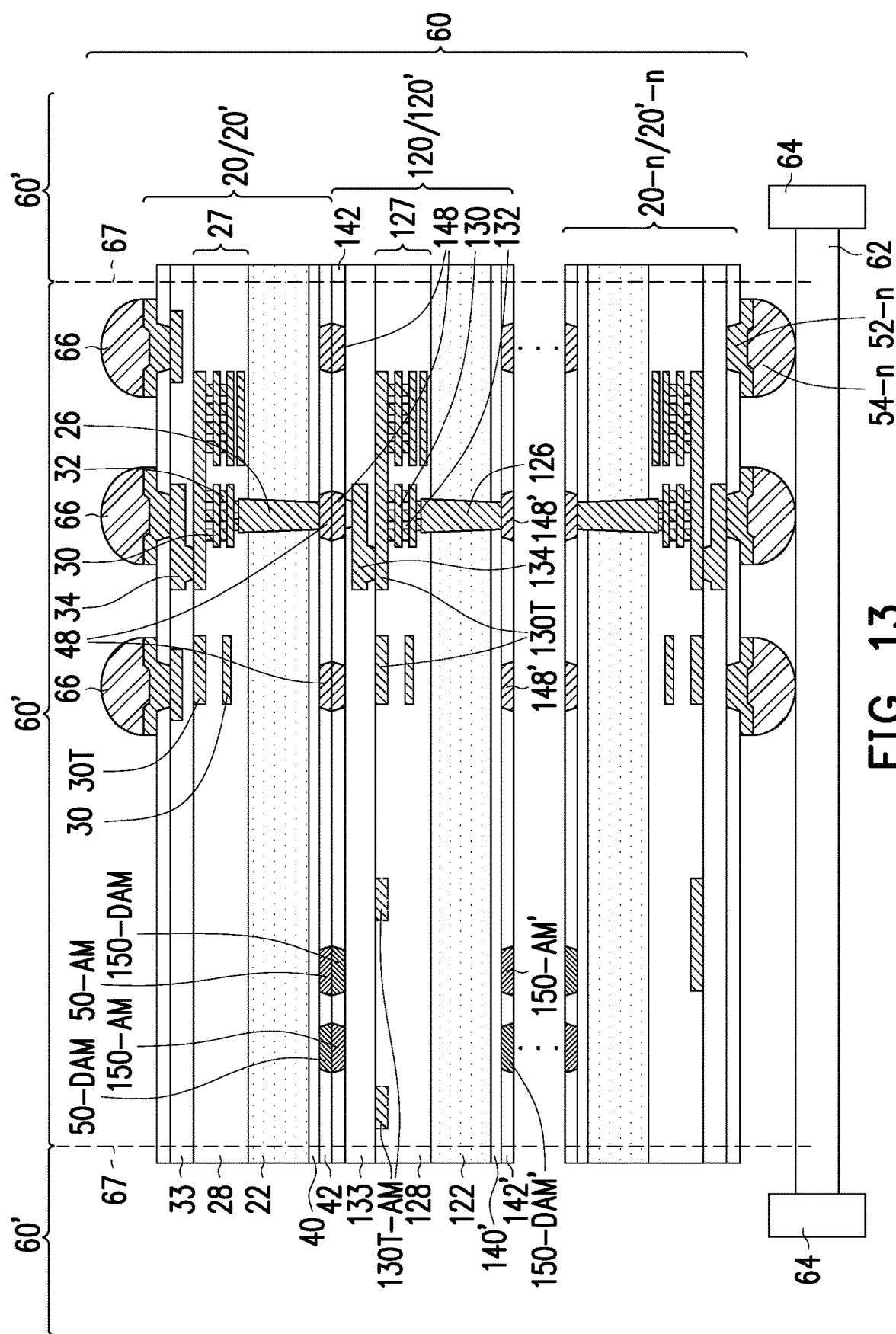

In a subsequent process, wafer stack 60 is de-bonded from carrier 10. The respective process is illustrated as process 226 in the process flow 200 as shown in FIG. 29. For example, a laser beam may be projected on release film 12, so that release film 12 is decomposed, releasing wafer stack 60. In subsequent processes, the wafer stack 60 may be flipped upside down, and is placed on another carrier (not shown) or tape 62, which is fixed on frame 64, as shown in FIG. 13. Electrical connectors 66 may then be formed on the front side of wafer 20. The respective process is illustrated as process 228 in the process flow 200 as shown in FIG. 29. Electrical connectors 66 may include solder regions. In accordance with alternative embodiments, electrical connectors 66 are formed before placing wafer 20 (as shown in FIG. 2) on carrier 10. In accordance with some embodiments in which the wafer-level bonding is performed, a singulation process may be performed to saw wafer stack 60 along scribe lines 67. Die stack 60 is sawed apart into discrete packages 60'. The respective process is illustrated as process 230 in the process flow 200 as shown in FIG. 29.

Figure 14A:
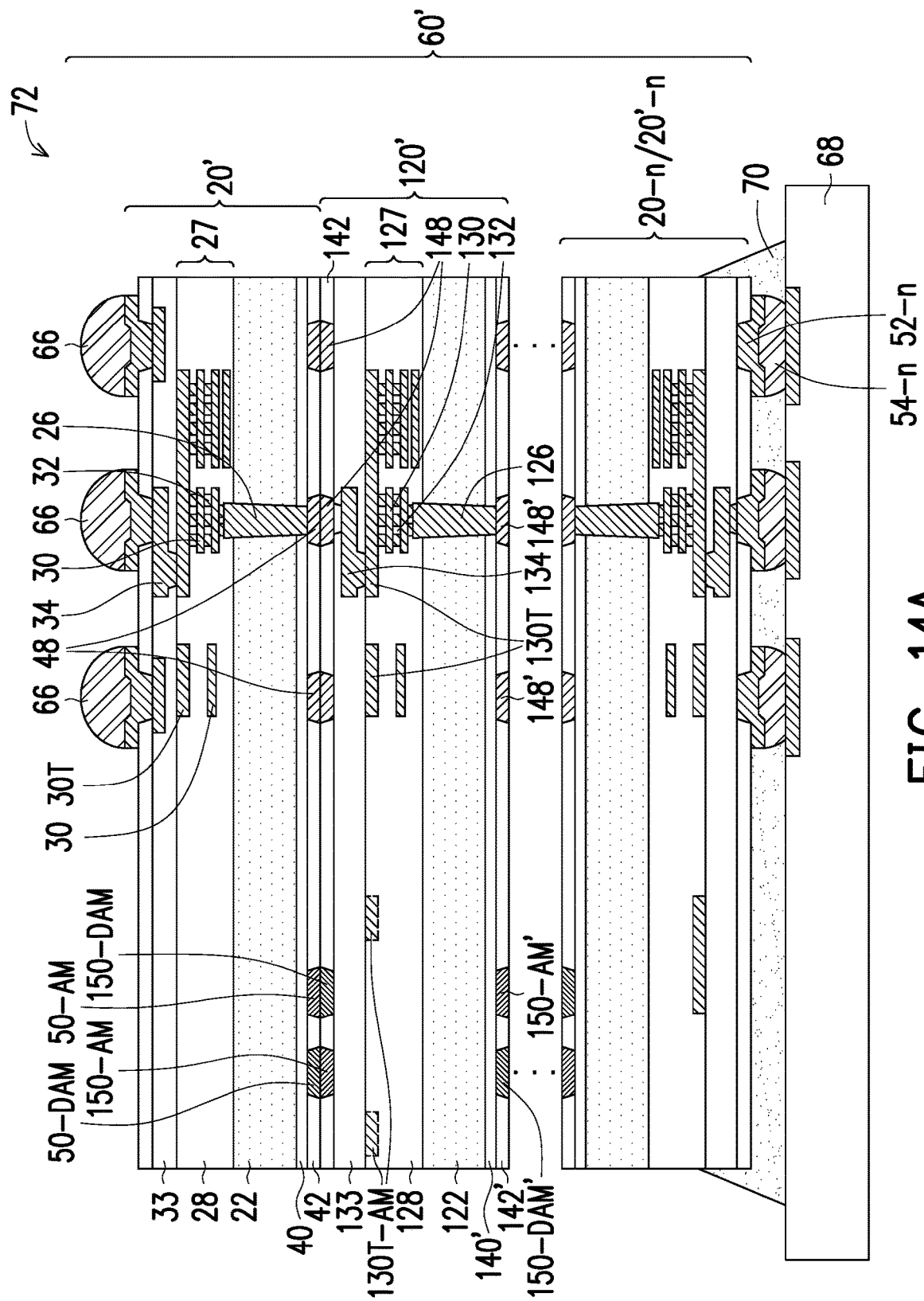

FIG. 14A illustrates an example in which package 60' is bonded to package component 68, which may be another package, an interposer, a package substrate, a printed circuit board, or the like. Underfill 70 may be dispensed into the gap between package 60' and package component 68. Package 72 is thus formed. Package 60' may also be bonded to an overlying package component (not shown) through electrical connectors 66.

Figure 14B:
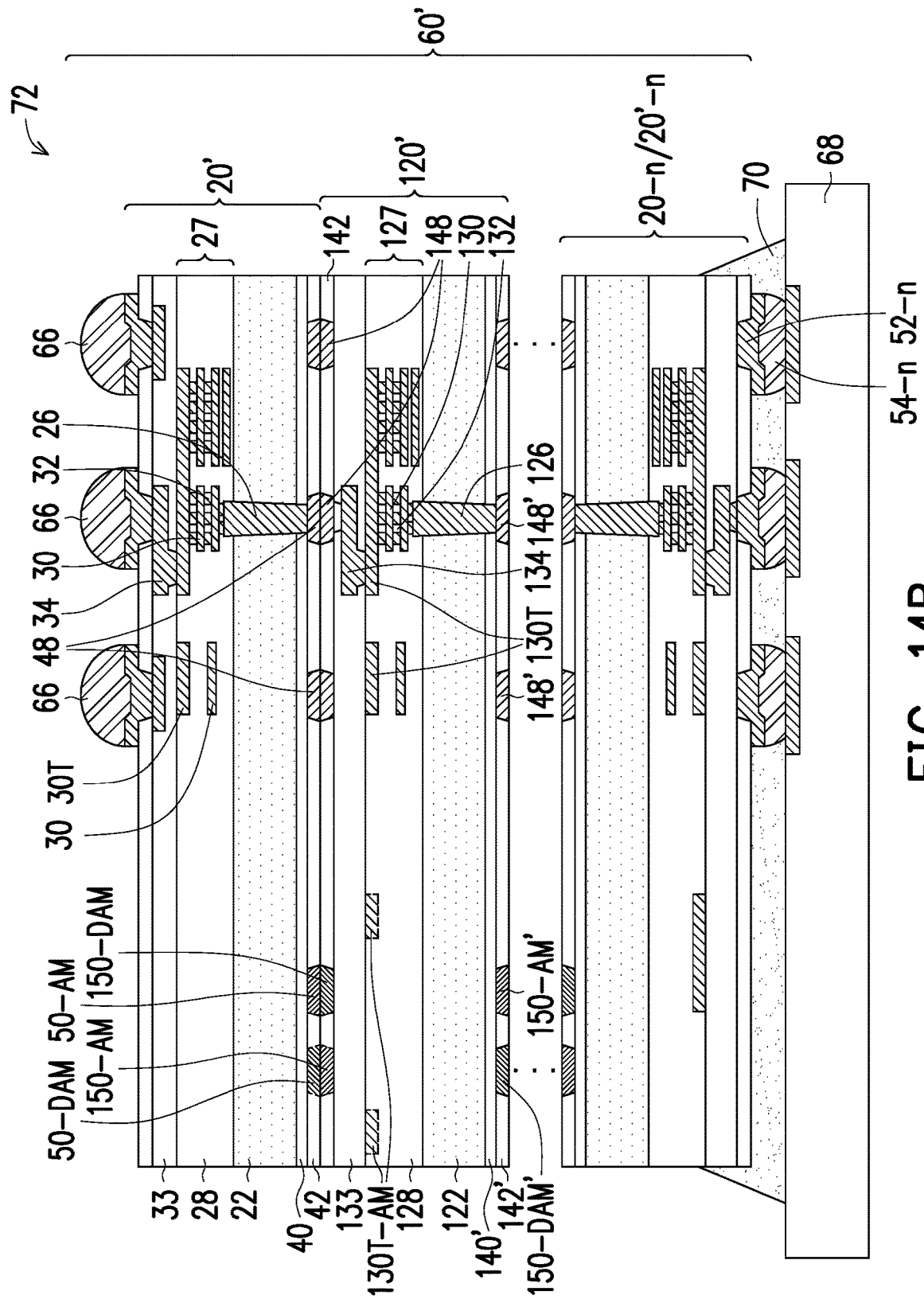
FIG. 14B illustrates a cross-sectional view of a die stack including alignment marks and dummy alignment marks in accordance with some embodiments.

FIGS. 14B, 18, 19, and 20 in combination illustrate package 72 in accordance with an alternative embodiment. FIG. 14B illustrates a cross-sectional view of package 72. Alignment mark 50-AM is formed on the surface of wafer 20, and in surface dielectric layer 42. The formation process may be essentially the same as described in previous embodiments. Dummy alignment mark 150-DAM is formed on the surface of wafer 120, and in surface dielectric layer 142. The features in dummy alignment mark 150-DAM overlap, and are bonded to, the features in dummy alignment mark 50-DAM with a one-to-one correspondence. In the alignment of wafer 120 to wafer 20, alignment mark 50-DAM is searched for by an aligner, and is used for the aligning and the positioning of wafer 20. Dummy alignment mark 50-DAM and alignment mark 150-AM may be, or may not be, formed in wafer 20 and 120, respectively.

The aligning and positioning of wafer 120, on the other hand, is not performed by using dummy alignment mark 150-DAM. Rather, the alignment is performed by using an embedded alignment mark, which is embedded inside wafer 120, rather than being on the surface of wafer 120. An example embedded alignment mark is 130T-AM. Alignment mark 130T-AM is also illustrated in FIG. 14A using dashed lines to indicate that it may, or may not be formed. In accordance with some embodiments, the embedded alignment mark (130T-AM in the illustrated embodiments) may be in the top metal layer (the same metal layer of top metal lines/pads 130T). The embedded alignment mark 130T-AM is formed in the same process as for forming the metal lines/pads 130 in the top metal layer of the wafer 120. To allow embedded alignment mark 130T-AM to be seen in the alignment process, the upper dielectric layers in wafer 120 covering the embedded alignment mark 130T-AM are transparent. The upper dielectric layers may include surface layer 142 and the dielectric layers between surface layer 142 and the embedded alignment mark. In accordance with alternative embodiments, the embedded alignment mark may be in another layer between the top metal layer 130 and surface layer 142. For example, the embedded alignment mark may be in the layer of metal pads 34. Alternatively, the embedded alignment mark may in a dielectric layer in which PPIs (if any) are formed, which dielectric layer is between metal pads 34 and surface layer 142.

Figure 18:
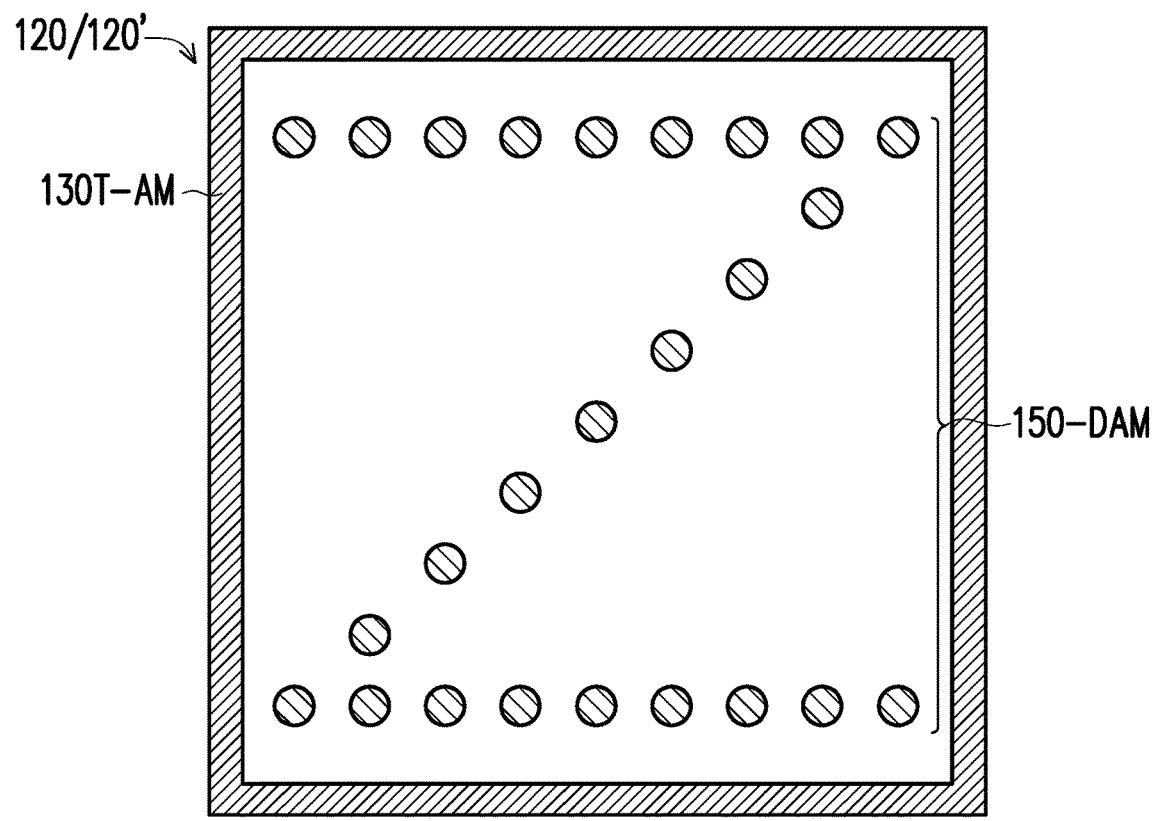
FIGS. 18, 19, and 20 illustrate top views of alignment marks and dummy alignment marks of a first-tier package component, a second-tier package component, and the bonded package components in accordance with some embodiments.

FIG. 18 illustrates a top view of dummy alignment mark 150-DAM and embedded alignment mark 130T-AM in wafer 120 in accordance with some embodiments. In the illustrated example, dummy alignment mark 150-DAM includes circular features therein, and the features may be arranged aligning to a letter (such as "Z" in the illustrated example). Embedded alignment mark 130T-AM may form a ring. In the top view or the bottom view of wafer 120, the ring encircles dummy alignment mark 150-DAM. Again, it is appreciated that the patterns and the shapes of the illustrated alignment marks and dummy alignment marks throughout the description are examples, and these marks may have any applicable arrangements and shapes that can be identified by the aligner. For example, in the top view, embedded alignment mark 130T-AM may be aside of dummy alignment mark 150-DAM, or may have another pattern/shape such as different letters, elongated strips, rectangular shapes, hexagonal shapes, or the like.

Figure 19:
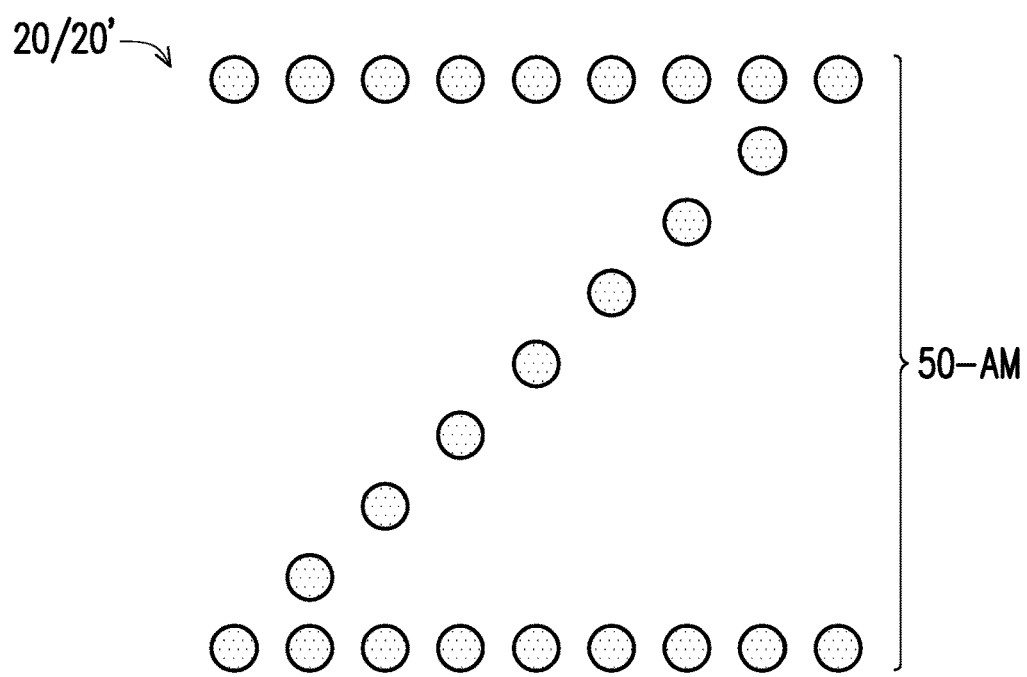
Figure 20:
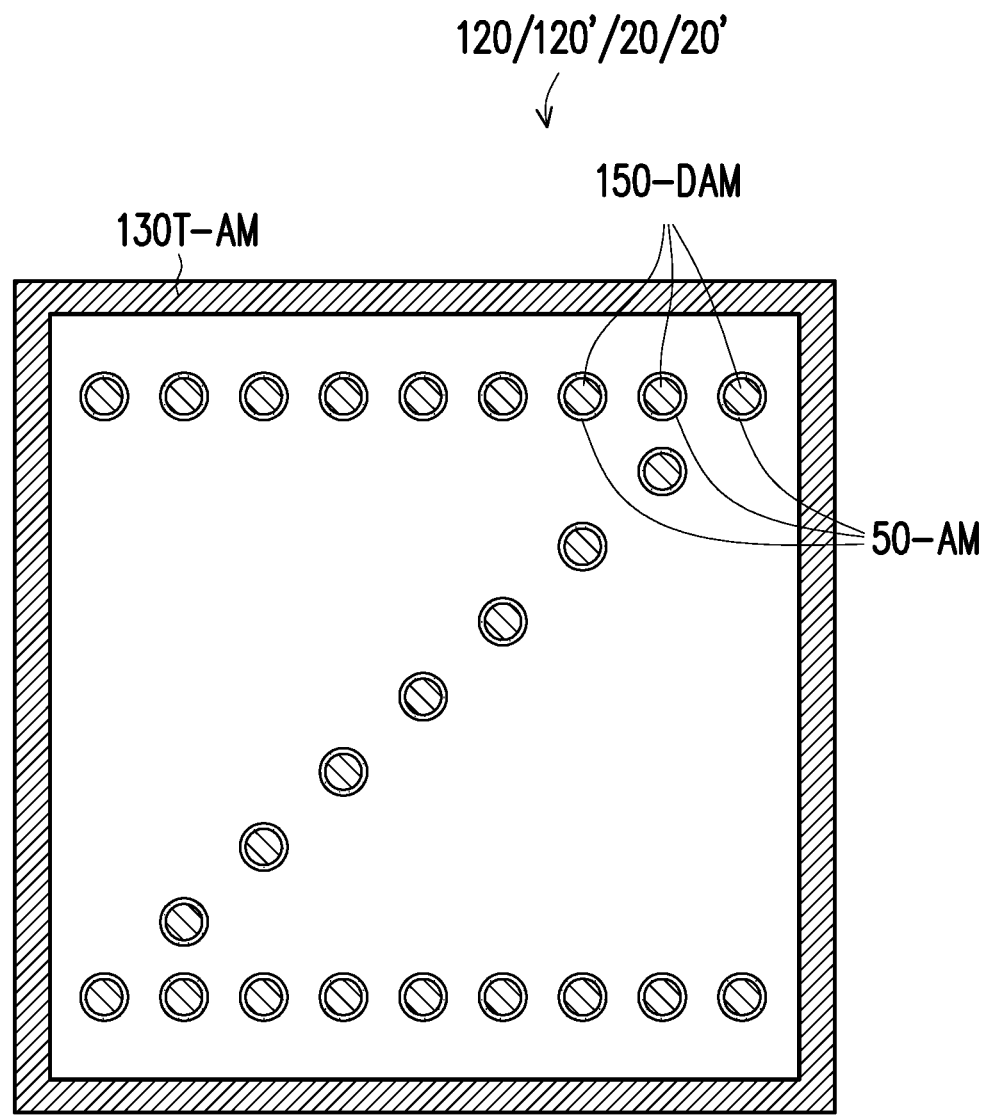

FIG. 19 illustrates a top view of alignment mark 50-AM in wafer 20 in accordance with some embodiments. The features in alignment mark 50-AM may have a same arrangement as dummy alignment mark 150-DAM (for example, aligned to a letter). FIG. 20 illustrates the top view of the (dummy) alignment marks after the bonding of wafer 120 to wafer 20. The features in dummy alignment mark 150-DAM may be bonded to the corresponding features in alignment mark 50-AM with a one-to-one correspondence. Alignment mark 130T-AM, on the other hand, is not bonded to any dummy alignment mark in wafer 20 since alignment mark 130T-AM is embedded, and is spaced apart from wafer 20 by surface dielectric layer 142.

In accordance with some embodiment, as discussed above, embedded alignment mark (such as 130T-AM) is formed in wafer 120, and there is no alignment mark (such as 150-AM) at the surface of in wafer 120. Accordingly, the positioning of wafer 120 and the alignment of wafer 120 to wafer 20 are based on embedded alignment mark (such as 130T-AM) in wafer 120, but not on the alignment mark at the surface of wafer 120. In accordance with alternative embodiments, both of alignment mark 150-AM and embedded alignment mark 130T-AM are formed in wafer 120, and both of alignment mark 50-AM and dummy alignment mark 50-DAM are formed in wafer 20. The positioning of wafer 120 and the alignment of wafer 120 to wafer 20 are thus based on both of alignment mark 150-AM and embedded alignment mark 130T-AM in wafer 120. Accordingly, in FIG. 14B, dummy alignment mark 150-DAM and alignment mark 50-DAM are illustrated as being dashed to indicate these features may be, or may not be, formed.

Figure 21:
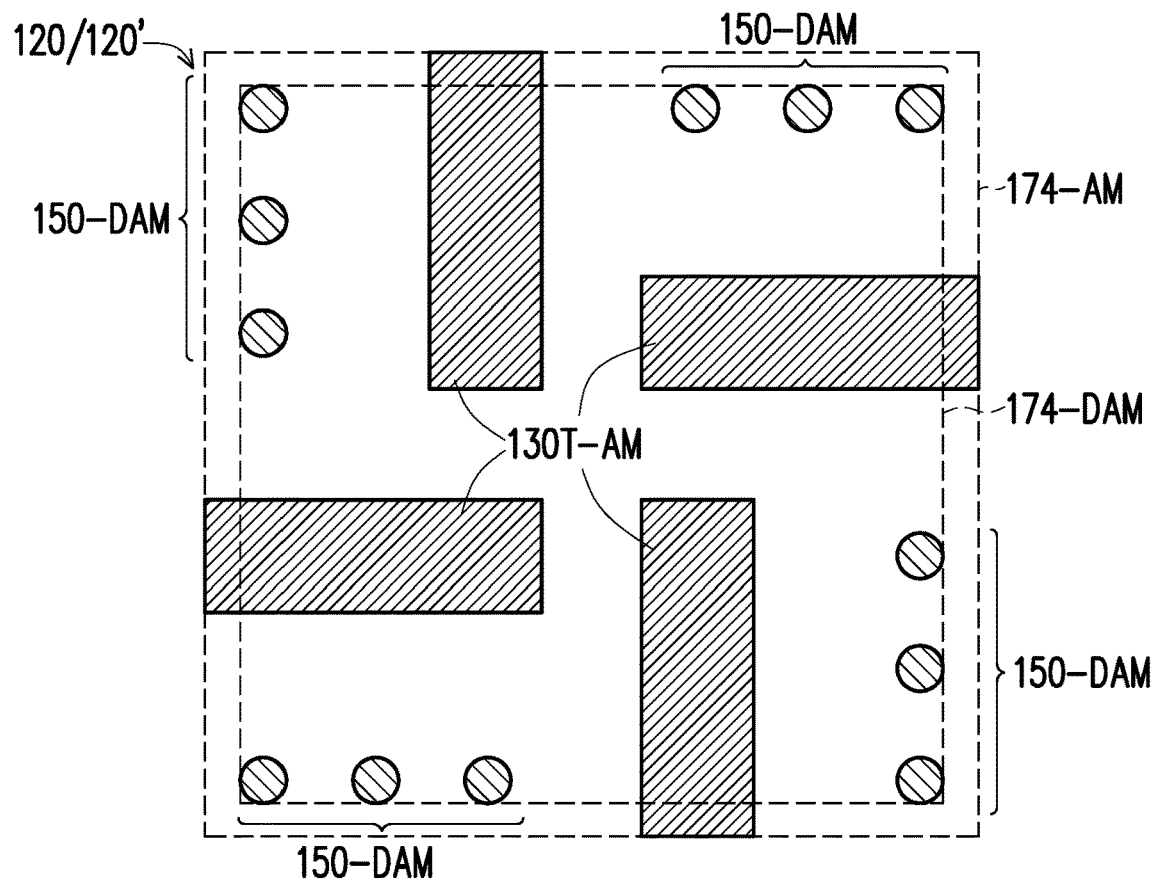
FIGS. 21, 22, and 23 illustrate top views of alignment marks and dummy alignment marks of a first-tier package component, a second-tier package component, and the bonded package components in accordance with some embodiments.
Figure 22:
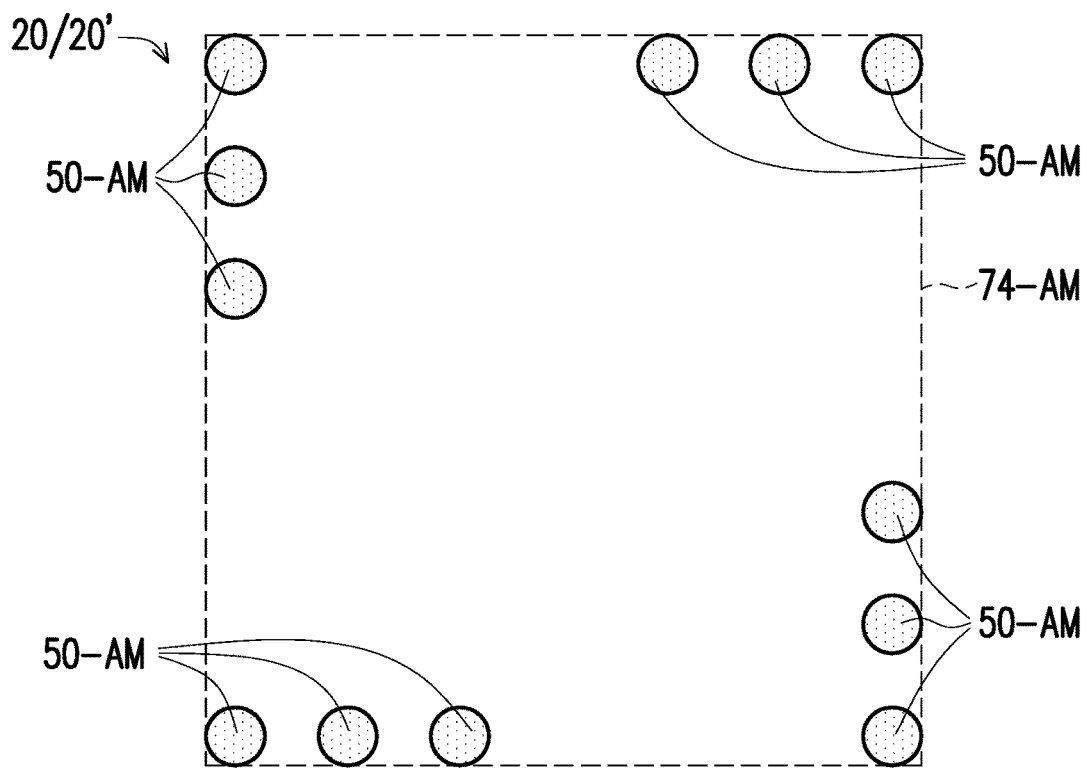
Figure 23:
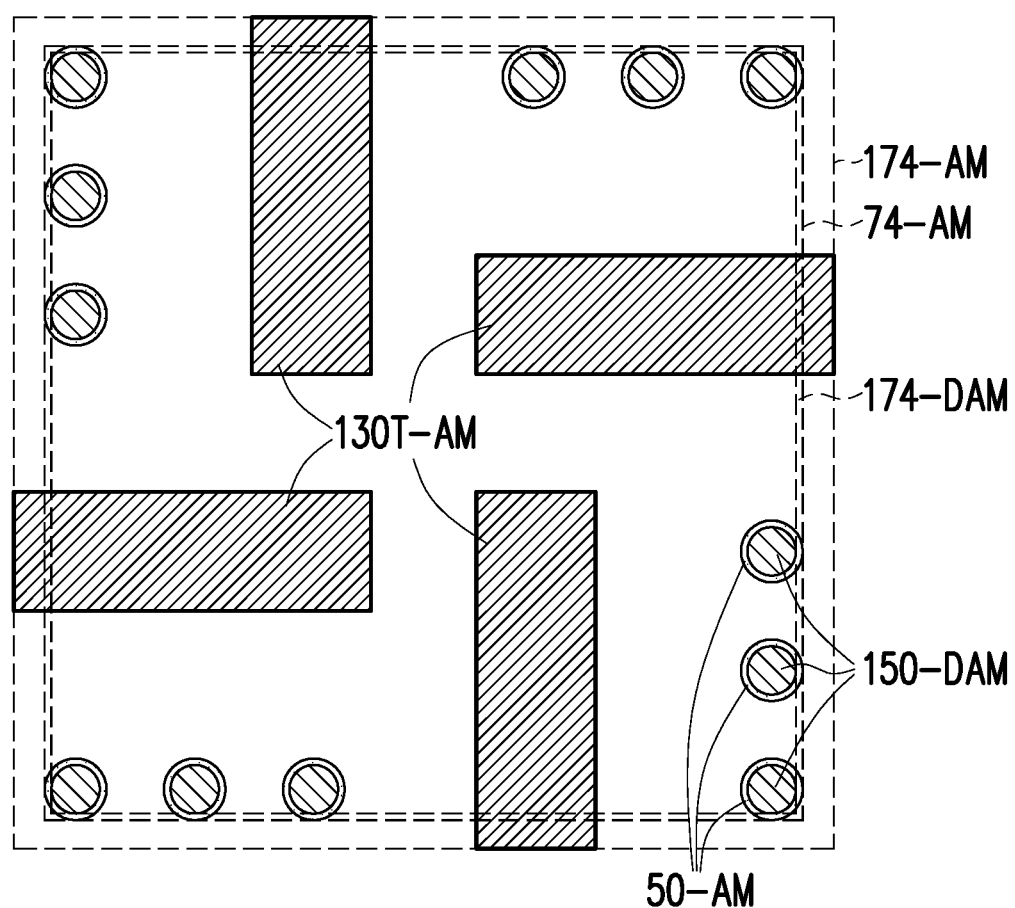

FIGS. 21, 22, and 23 illustrate the alignment marks and dummy alignment marks in accordance with alternative embodiments. The cross-sectional view of the corresponding (dummy) alignment marks may also be represented by FIG. 14B, which illustrates embedded alignment mark 130T-AM, dummy alignment mark 150-DAM, and alignment mark 50-AM. Referring to FIG. 21, embedded alignment mark 130T-AM includes a plurality of elongated strips, and dummy alignment mark 150-DAM includes a plurality of circular feature aligned to a plurality of straight lines. FIG. 22 illustrates alignment mark 50-AM, which includes a plurality of circular patterns aligned to a plurality of straight lines. FIG. 23 illustrates the top view of the (dummy) alignment marks after the bonding of wafer 120 to wafer 20. The upper alignment mark 50-AM is drawn as transparent in FIG. 23 to show the underlying dummy alignment mark 150-DAM, but is not limited to transparent materials. The features in dummy alignment mark 150-DAM are bonded to the corresponding features in alignment mark 50-AM with a one-to-one correspondence. Alignment mark 130T-AM, on the other hand, is not bonded to any dummy alignment mark in wafer 20.

Figure 24:
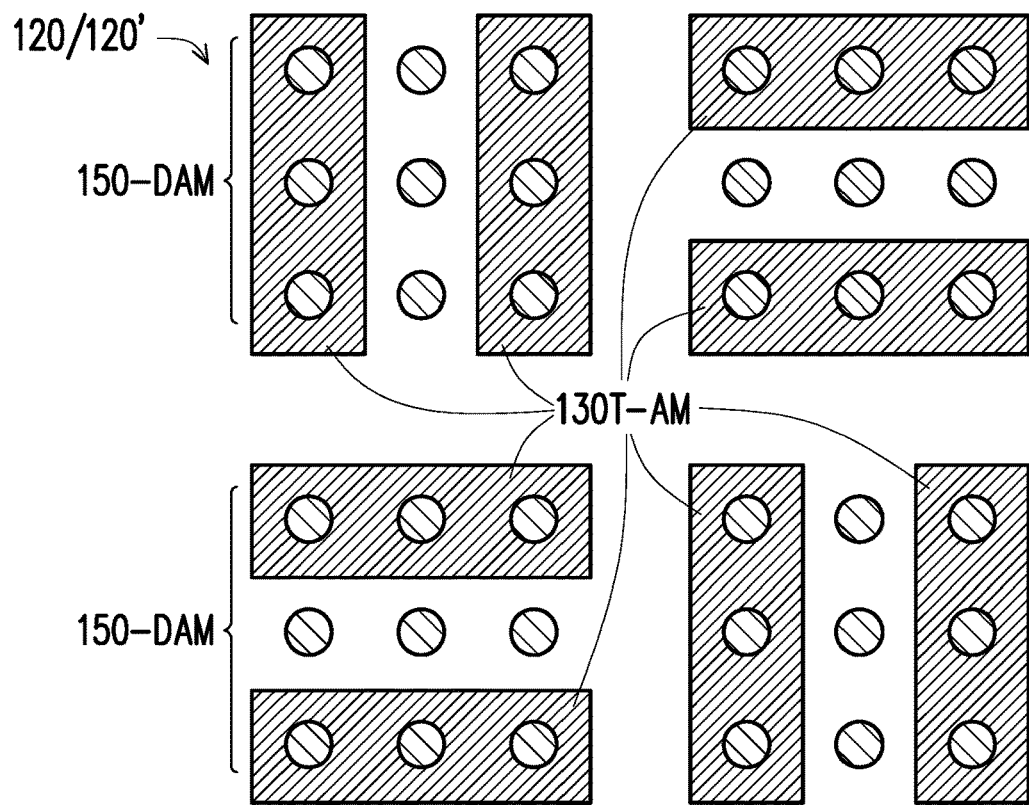
FIGS. 24, 25, and 26 illustrate top views of alignment marks and dummy alignment marks of a first-tier package component, a second-tier package component, and the bonded package components in accordance with some embodiments.
Figure 25:
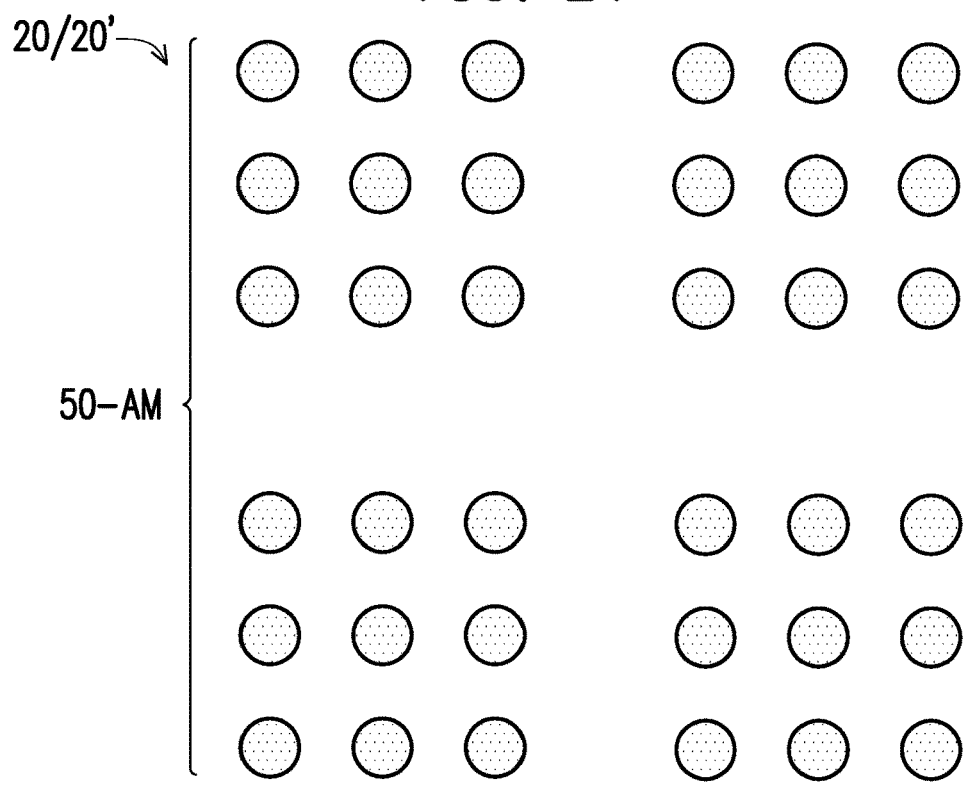
Figure 26:
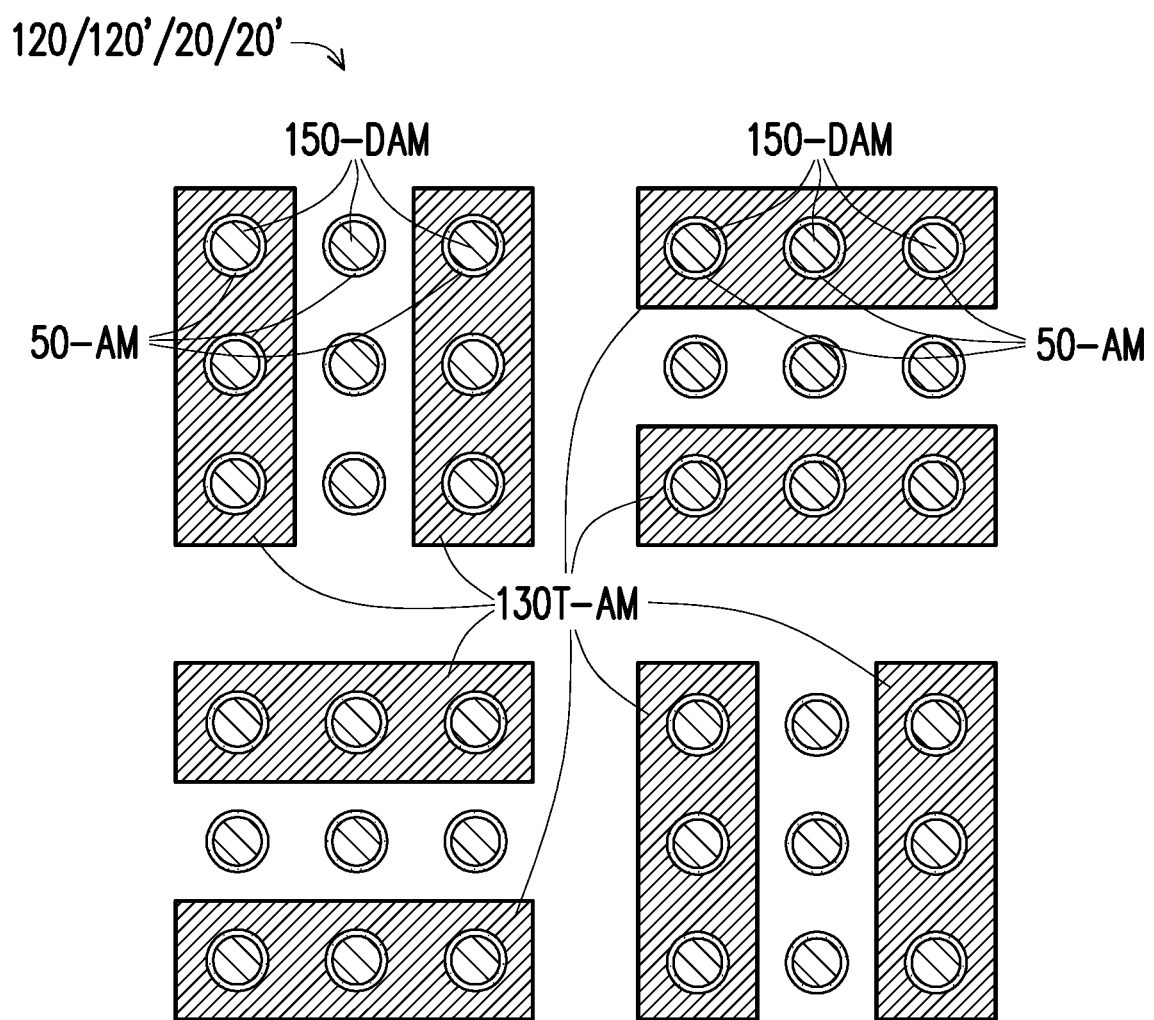

FIGS. 24, 25, and 26 illustrate the alignment marks and dummy alignment marks in accordance with alternative embodiments. The cross-sectional view of the corresponding (dummy) alignment marks may also be represented by FIG. 14B, which illustrates embedded alignment mark 130T-AM, dummy alignment mark 150-DAM, and alignment mark 50-AM. Referring to FIG. 24, embedded alignment mark 130T-AM includes a plurality of elongated strips, and dummy alignment mark 150-DAM includes a plurality of circular patterns arranged as an array. The arrangement of the patterns in dummy alignment mark 150-DAM as an array may make the pattern density more uniform, so that a larger alignment mark may be formed without worsening pattern loading effect.

In accordance with some embodiments, the embedded alignment mark 130T-AM may overlap (or overlapped by depending on the viewing orientation) some of the patterns in dummy alignment mark 150-DAM. In accordance with alternative embodiments, the embedded alignment mark 130T-AM may overlap all of the patterns in dummy alignment mark 150-DAM. FIG. 25 illustrates alignment mark 50-AM, which includes a plurality of circular patterns that also form an array. In accordance with some embodiments, as shown in FIGS. 24 and 25, the array of dummy alignment mark 150-DAM (and the array of alignment mark 50-AM) have non-uniform spacings and include sub-arrays with uniform spacings. In accordance with alternative embodiments, all of alignment mark 50-AM and dummy alignment mark 50-DAM may have a uniform spacing. FIG. 26 illustrates the top view of the (dummy) alignment marks after the bonding of wafer 120 to wafer 20. The upper alignment mark 50-AM is drawn as transparent in FIG. 26 to show the underlying dummy alignment mark 150-DAM, but is not limited to transparent materials. The features in dummy alignment mark 150-DAM are bonded to the corresponding features in alignment mark 50-AM with a one-to-one correspondence. Alignment mark 130T-AM, on the other hand, is not bonded to any dummy alignment mark in wafer 20.

Referring again to FIGS. 15 through 26, it is observed that dummy alignment marks and alignment marks may have rectangular contours. The contours of the alignment marks are the rectangles drawn aligning to the edges of alignment marks. For example, as shown in FIG. 21, alignment mark 130T-AM has contour 174-AM, and dummy alignment mark 150-DAM has contour 174-DAM. As shown in FIG. 22, alignment mark 50-AM has contour 74-AM. As shown in FIG. 23, contours 174-AM, 174-DAM, and 74-AM have overlapped area, and occupy the same chip area of package 72 (FIG. 14B). The overlapping of contour areas may be partial overlapping, with a part of a first contour area occupied by the dummy alignment mark partially overlapping a part of a second contour area occupied by the alignment mark. There is, however, at least a part of the first contour area or the second contour area not overlapped by the other with the partial overlapping. Alternatively, the overlapping may be full overlapping, with the first contour area and the second contour area occupy the exact same chip area of package 72 (FIG. 14B).

In addition, as shown in FIGS. 15 through 26, in the top view of wafers 20 and/or 120, the patterns of the dummy alignment mark and the patterns of the corresponding alignment mark may be inter-mixed. For example, at least one of the features of dummy alignment marks 50-DAM (or 150-DAM) may be inserted between the features of the corresponding alignment marks 50-AM (or 150-AM). Also, at least one of the features of alignment marks 50-AM (or 150-AM) may be inserted between the features of the corresponding dummy alignment marks 50-DAM (or 150-DAM).

FIG. 27 illustrates an embodiment in which the alignment marks and/or dummy alignment marks in wafer 120 have different sizes than the alignment marks and/or dummy alignment marks in wafer 20. For example, in the illustrated embodiments, alignment marks 150-AM and dummy alignment marks 150-DAM in wafer 120 are smaller (in lateral dimension) than the corresponding dummy alignment marks 50-DAM and alignment marks 50-AM in wafer 20. This is also illustrated in the example embodiment as shown in FIG. 17. In accordance with alternative embodiments as shown in FIG. 28, the alignment marks and/or dummy alignment marks in wafer 120 have the sizes same as, or greater than, the alignment marks and/or dummy alignment marks in wafer 20.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming dummy alignment marks together with alignment marks, the dummy alignment marks of one wafer, although not used for alignment, may form metal-to-metal bonding with the alignment marks of another wafer. Accordingly, the non-bonding issue that occurred in the bonding using conventional alignment marks is avoided, and the bonding quality of hybrid bonding is improved.

In accordance with some embodiments of the present disclosure, a method comprises placing a first package component, wherein the first package component comprises a first alignment mark; and a first dummy alignment mark; aligning a second package component to the first package component, wherein the second package component comprises a second alignment mark; and a second dummy alignment mark, wherein the aligning is performed using the first alignment mark for positioning the first package component, and using the second alignment mark for positioning the second package component; and bonding the second package component to the first package component to form a package, wherein after the bonding, the first alignment mark is bonded to the second dummy alignment mark. In an embodiment, the first alignment mark comprises a first plurality of discrete features, the second dummy alignment mark comprises a second plurality of discrete features, and wherein the first plurality of discrete features are bonded to the second plurality of discrete features with a one-to-one correspondence. In an embodiment, after the bonding, the second alignment mark is bonded to the first dummy alignment mark. In an embodiment, the first alignment mark comprises a first plurality of discrete features, the first dummy alignment mark comprises a second plurality of discrete features, and wherein the first plurality of discrete features and the second plurality of discrete features are inter-mixed. In an embodiment, a first surface dielectric layer in the first package component is bonded to a second surface dielectric layer in the second package component through fusion bonding, and the first alignment mark is bonded to the second dummy alignment mark through metal-to-metal direct bonding. In an embodiment, the second alignment mark is an embedded alignment mark, and after the bonding, the second alignment mark is physically spaced apart from the first package component. In an embodiment, the bonding the second package component to the first package component comprises bonding a second wafer to the first wafer. In an embodiment, the first alignment mark has a first outer contour, and the first dummy alignment mark has a second outer contour, and wherein the first outer contour at least partially overlaps the second outer contour. In an embodiment, the first alignment mark comprises a first plurality of discrete features, the second dummy alignment mark comprises a second plurality of discrete features, and wherein each of the first plurality of discrete features is smaller than a corresponding one of the second plurality of discrete features. In an embodiment, the first alignment mark comprises a first plurality of discrete features, the second dummy alignment mark comprises a second plurality of discrete features, and wherein each of the first plurality of discrete features has a same size as, and fully overlaps, a corresponding one of the second plurality of discrete features.

In accordance with some embodiments of the present disclosure, a method comprises aligning a first wafer to a second wafer using a first alignment mark in the first wafer and a second alignment mark in the second wafer, wherein the second alignment mark is in a same chip area as a dummy alignment mark in the second wafer; and bonding the first wafer to the second wafer through hybrid bonding, wherein after the bonding, the first alignment mark in the first wafer is bonded to the dummy alignment mark in the second wafer. In an embodiment, after the bonding, the second alignment mark in the second wafer is bonded to an additional dummy alignment mark in the first wafer. In an embodiment, the second alignment mark in the second wafer is embedded in the second wafer, and after the bonding, the second alignment mark is separated from the first wafer by a dielectric layer in the second wafer. In an embodiment, the second alignment mark comprises a ring, and in a top view of the second wafer and the first wafer, the ring encircles the second dummy alignment mark and the first alignment mark. In an embodiment, the first alignment mark and the dummy alignment mark comprise circular patterns.

In accordance with some embodiments of the present disclosure, a method comprises searching for a first alignment mark in a first package component, wherein the first package component further comprises a first dummy alignment mark occupying a same chip area as the first alignment mark; searching for a second alignment mark in a second package component, wherein the second package component further comprises a second dummy alignment mark occupying a same chip area as the second alignment mark; aligning the second package component to the first package component using the first alignment mark and the second alignment mark; and bonding the second package component with the first package component. In an embodiment, during the searching for the first alignment mark, the first dummy alignment mark is not searched for. In an embodiment, after the bonding, the first alignment mark is bonded to the second dummy alignment mark, and the second alignment mark is bonded to the first dummy alignment mark. In an embodiment, a plurality of first discrete patterns in the first alignment mark are bonded to a plurality of second discrete patterns in the second dummy alignment mark with a one-to-one correspondence. In an embodiment, a plurality of third discrete patterns in the second alignment mark are bonded to a plurality of fourth discrete patterns in the first dummy alignment mark with a one-to-one correspondence.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
placing a first package component, wherein the first package component comprises:
a first alignment mark; and a first dummy alignment mark, wherein both of the first alignment mark and the first dummy alignment mark are electrically floating;

aligning a second package component to the first package component, wherein the second package component comprises:
  a second alignment mark; and
  a second dummy alignment mark, wherein both of the second alignment mark and the second dummy alignment mark are electrically floating, wherein the aligning comprises searching for a first pattern of the first alignment mark for positioning the first package component, and the aligning is performed ignoring a second pattern of the first dummy alignment mark; and bonding the second package component to the first package component to form a package, wherein after the bonding, the first alignment mark is bonded to the second dummy alignment mark.

2. The method of claim 1, wherein the aligning further comprises searching for a third pattern of the second alignment mark for positioning the second package component, and the aligning is performed ignoring a fourth pattern of the second dummy alignment mark.

3. The method of claim 1, wherein the first alignment mark comprises a first plurality of discrete features, the second dummy alignment mark comprises a second plurality of discrete features, and wherein the first plurality of discrete features are bonded to the second plurality of discrete features with a one-to-one correspondence.

4. The method of claim 3, wherein the first plurality of discrete features have same shapes and same sizes as corresponding ones of the second plurality of discrete features.

5. The method of claim 1, wherein the first alignment mark comprises a first plurality of discrete features, the second dummy alignment mark comprises a second plurality of discrete features, and wherein each of the first plurality of discrete features is smaller than a corresponding one of the second plurality of discrete features.

6. The method of claim 1, wherein the first alignment mark comprises a first plurality of discrete features disposed in a first top-view area of the first package component, and the first dummy alignment mark comprises a second plurality of discrete features disposed in a second top-view area of the first package component, and wherein the first top-view area and the second top-view area have a common area.

7. The method of claim 6, wherein an entirety of the first top-view area is in the second top-view area.

8. The method of claim 1, wherein the first alignment mark and the first dummy alignment mark are formed in a same dielectric layer, and are formed by a same formation process.

9. The method of claim 1, wherein the first alignment mark comprises a first plurality of discrete features, the first dummy alignment mark comprises a second plurality of discrete features, and wherein the first plurality of discrete features and the second plurality of discrete features are interlaced.

10. The method of claim 1, wherein a first surface dielectric layer in the first package component is bonded to a second surface dielectric layer in the second package component through fusion bonding, and the first alignment mark is bonded to the second dummy alignment mark through metal-to-metal direct bonding.

11. The method of claim 1, wherein the second alignment mark is an embedded alignment mark, and after the bonding, the second alignment mark is physically spaced apart from the first package component.

12. The method of claim 1, wherein the bonding the second package component to the first package component comprises bonding a second wafer to a first wafer.

13. A method comprising:
providing a first wafer comprising:
  a first alignment mark comprising a plurality of discrete metallic features having a first outer contour; and
  a first dummy alignment mark having a second outer contour, wherein the first outer contour and the second outer contour have an overlapped region;
aligning the first wafer to a second wafer using the first alignment mark in the first wafer and a second alignment mark in the second wafer, wherein the second alignment mark is in a same chip area as a second dummy alignment mark in the second wafer; and
bonding the first wafer to the second wafer through hybrid bonding, wherein after the bonding, the first alignment mark in the first wafer is directly bonded to the second dummy alignment mark in the second wafer.

14. The method of claim 13, wherein both of the first alignment mark and the second alignment mark are electrically floating.

15. The method of claim 13, wherein each of the plurality of discrete metallic features is electrically floating.

16. The method of claim 13, wherein the second alignment mark in the second wafer is embedded in the second wafer.

17. The method of claim 16, wherein the second alignment mark comprises a ring, and in a top view of the second wafer and the first wafer, the ring encircles the first alignment mark and the first dummy alignment mark.

18. The method of claim 13, wherein the aligning is performed by an aligner, and wherein in the aligning, the aligner searches for a first pattern of the first alignment mark, and the aligner ignores a second pattern of the first dummy alignment mark.

19. A method comprising:
forming a first alignment mark and a first dummy alignment mark in a first wafer, wherein the first alignment mark is in a same first area of the first wafer as the first dummy alignment mark;
forming a second alignment mark and a second dummy alignment mark in a second wafer, wherein the second alignment mark is in a same second area of the second wafer as the second dummy alignment mark;
searching for a first pattern of the first alignment mark in the first wafer to find the first alignment mark;
searching for a second pattern of the second alignment mark in the second wafer to find the second alignment mark;
using the first alignment mark and the second alignment mark that have been found to align the first wafer and the second wafer; and
with the first wafer being aligned to the second wafer, bonding the second wafer to the first wafer.

20. The method of claim 19, wherein each of the first alignment mark, the first dummy alignment mark, the second alignment mark, and the second dummy alignment mark is electrically floating.

* * * * *